(12) United States Patent
Shinkai

(10) Patent No.: US 7,766,458 B2
(45) Date of Patent: Aug. 3, 2010

(54) INKJET HEAD CAPABLE OF SUPPRESSING HINDRANCE OF DEFORMATION OF A PIEZOELECTRIC ELEMENT

(75) Inventor: Yuji Shinkai, Handa (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 682 days.

(21) Appl. No.: 11/710,561

(22) Filed: Feb. 26, 2007

(65) Prior Publication Data

US 2007/0159511 A1  Jul. 12, 2007

Related U.S. Application Data

(62) Division of application No. 10/667,350, filed on Sep. 23, 2003, now Pat. No. 7,562,428.

(30) Foreign Application Priority Data

Sep. 24, 2002  (JP)  ............... 2002-277136

(51) Int. Cl.
  *B41J 2/05*  (2006.01)
  *B41J 2/14*  (2006.01)
  *B41J 2/045*  (2006.01)
  *H01L 41/22*  (2006.01)
  *B23P 17/00*  (2006.01)

(52) U.S. Cl. ............... 347/59; 347/48; 347/68; 29/25.35; 29/890.1

(58) Field of Classification Search ............... 347/68, 347/59, 50, 58, 69–72, 54, 20, 48; 29/842, 29/831, 841, 890.1, 25.35, 840, 830; 228/180.21, 228/180.22; 257/737, 738, 779, 778; 438/455, 438/118, 119

See application file for complete search history.

(56) References Cited

U.S. PATENT DOCUMENTS

| | | | |
|---|---|---|---|
| 5,508,561 A | 4/1996 | Tago et al. | |
| 6,000,127 A | 12/1999 | Eifuku et al. | |
| 6,095,641 A | 8/2000 | Kishi | |
| 6,270,193 B1 | 8/2001 | Hiwada | |
| 6,345,887 B1 | 2/2002 | Sato | |
| 6,464,324 B1 | 10/2002 | Le et al. | |
| 6,550,897 B2 | 4/2003 | Nakamura et al. | |
| 2002/0075362 A1 | 6/2002 | Nakamura et al. | |
| 2002/0130930 A1 | 9/2002 | Moriya et al. | |
| 2003/0112298 A1 | 6/2003 | Sato et al. | |

FOREIGN PATENT DOCUMENTS

| | | |
|---|---|---|
| EP | 0 974 465 A1 | 1/2000 |
| JP | A-5-512 | 1/1993 |
| JP | A-5-193130 | 8/1993 |

(Continued)

*Primary Examiner*—Stephen D Meier
*Assistant Examiner*—Rene Garcia, Jr.
(74) *Attorney, Agent, or Firm*—Oliff & Berridge, PLC

(57) ABSTRACT

An inkjet head includes an ink passage unit, an actuator unit; a printed circuit board; a metallic bond for electrically connecting a land to a terminal, the metallic bond being disposed in at least one of a region between the land and the terminal and a region extending over the land and the terminal along the peripheries of the land and the terminal; and a protrusion disposed on the connecting portion between a main electrode portion and the land.

20 Claims, 16 Drawing Sheets

FOREIGN PATENT DOCUMENTS

| | | |
|---|---|---|
| JP | A-6-320721 | 11/1994 |
| JP | A-07-081048 | 3/1995 |
| JP | A-7-156376 | 6/1995 |
| JP | A-8-156252 | 6/1996 |
| JP | A-09-272202 | 10/1997 |
| JP | A-11-240152 | 9/1999 |
| JP | A-11-254670 | 9/1999 |
| JP | 2000108344 A * | 4/2000 |
| JP | A-2000-127404 | 5/2000 |
| JP | A-2000-135789 | 5/2000 |
| JP | A-2000-263781 | 9/2000 |
| JP | A-2001-179993 | 7/2001 |
| JP | A-2001-301178 | 10/2001 |
| JP | A-2002-248765 | 9/2002 |

* cited by examiner

INKJET HEAD CAPABLE OF SUPPRESSING HINDRANCE OF DEFORMATION OF A PIEZOELECTRIC ELEMENT

This is a Division of application Ser. No. 10/667,350 filed Sep. 23, 2003. The disclosure of the prior application is hereby incorporated by reference herein in its entirety.

BACKGROUND OF THE INVENTION

1. Field of the Invention

The present invention relates to an inkjet head for ejecting ink onto a record medium to print, and also to a manufacturing method of the inkjet head.

2. Description of Related Art

An inkjet head used in an inkjet printer includes therein an ink tank and pressure chambers. Each pressure chamber is supplied with ink from the ink tank. When a piezoelectric element provided above a pressure chamber is deformed to change the volume of the pressure chamber, pressure is applied to ink in the pressure chamber so that the ink is ejected through a nozzle connected to the pressure chamber. To deform the piezoelectric element, in general, a driving signal is supplied to a surface electrode provided on a face of the piezoelectric element opposite to the pressure chamber. An electric field is thereby applied to the piezoelectric element. The surface electrode is connected to a terminal on a printed circuit board such as a flexible printed circuit (FPC). The driving signal is supplied to the surface electrode through the printed circuit board from a driver IC connected to the printed circuit board.

In general, electrical connection between the terminal of the printed circuit board and the surface electrode is realized in the manner that solder interposed between the terminal and surface electrode is melted with heat (see JP-A-7-156376). Besides, there is known a method using no solder (see JP-A-8-156252). In the method using no solder, a printed circuit board is prepared on which two films are put in layers. The lower film has a cut-out portion larger in area than the surface electrode. A terminal smaller in area than the surface electrode is provided on the lower face of the upper film within the cut-out portion of the lower film. After a conductive adhesive is dropped on the surface electrode, the terminal is pressed onto the surface electrode so that they are electrically connected to each other. The connecting portion between the terminal and the surface electrode is at a position opposite to a pressure chamber.

In the above technique using solder for electrically connecting the terminal of the printed circuit board and the surface electrode to each other, however, the solder having melted with heat to have high fluidity may move into a region on the surface electrode opposite to the pressure chamber. In this case, deformation of a piezoelectric element upon ink ejection may be hindered due to the rigidity of the solder. This causes deterioration of ink ejection performance. To avoid this, for example, such a measure is taken as elongating distances between neighboring connecting portions of the terminal and the surface electrode, however, this is contrary to high integration. Furthermore, in case the surface electrode is made of metal, the surface electrode is easily diffused into solder when the solder adheres to a surface electrode. This may cause rise of the resistance between the surface electrode and the terminal, and at worst, electrical braking may happen.

In addition, when surface electrodes corresponding to the respective pressure chambers are connected to terminals corresponding to the respective surface electrodes, solder having melted to have high fluidity may cause a short circuit between neighboring connecting portions.

In the above technique using a conductive adhesive in place of solder, because the conductive adhesive is lower in fluidity than solder upon being heated, the conductive adhesive stays within each cut-out portion of the lower film on the printed circuit board. Therefore, the above-described problems with the case of using solder, such as hindrance of deformation of a piezoelectric element, rise of the resistance, braking, and a short circuit, are relieved in comparison. However, because the connecting portion between the terminal and the surface electrode is at a position opposite to a pressure chamber as described above, there is a problem that deformation of a piezoelectric element upon ink ejection is hindered. This makes it difficult to change the volume of the pressure chamber and thus it causes deterioration of ink ejection performance.

SUMMARY OF THE INVENTION

An object of the present invention is to provide an inkjet head capable of suppressing hindrance of deformation of a piezoelectric element, and to provide a manufacturing method of the inkjet head.

Another object of the present invention is to provide an inkjet head capable of suppressing hindrance of deformation of a piezoelectric element, rise of the resistance, braking, and a short circuit between terminals with suppressing hindrance of deformation of a piezoelectric element, and to provide a manufacturing method of the inkjet head.

According to an aspect of the present invention, an inkjet head comprises an ink passage unit including pressure chambers and a plurality of wall portions defining each of the plurality of pressure chambers; and an actuator unit including a piezoelectric element disposed on the ink passage unit, a surface electrode disposed on the piezoelectric element and having a main electrode portion opposed to a pressure chamber and a connecting portion opposed to a wall portion, and a land disposed on the piezoelectric element in a region opposed to the wall portion. The land is electrically connected to the surface electrode. The inkjet head further comprises a printed circuit board on which a terminal electrically connected to the land and a predetermined wiring pattern are provided; and a metallic bond for electrically connecting the land to the terminal. The metallic bond is disposed in at least one of a region between the land and the terminal and a region extending over the land and the terminal along the peripheries of the land and the terminal. The inkjet head further comprises a protrusion disposed on the connecting portion.

According to the invention, because the connecting portion between the land and the terminal is in a region not opposed to the pressure chamber, hindrance of deformation of the piezoelectric element can be suppressed. Further, because the protrusion is formed on the surface electrode in a region not opposed to the pressure chamber, movement of the metallic bond, which has been melted to have high fluidity, to a region of the surface electrode opposed to the pressure chamber, i.e., the main electrode portion, can be suppressed. Therefore, the problem such as hindrance of deformation of the piezoelectric element due to the rigidity of the metallic bond such as solder, can be relieved. Also, because adhesion of the metallic bond such as solder to the surface electrode is suppressed, the problems such as rise of the resistance and braking can be relieved.

According to another aspect of the present invention, an inkjet head comprises an ink passage unit including pressure chambers and a plurality of wall portions defining each of the plurality of pressure chambers; and an actuator unit including a piezoelectric element disposed on the ink passage unit, a surface electrode disposed on the piezoelectric element and having a main electrode portion opposed to a pressure chamber and a connecting portion opposed to a wall portion, and a land disposed on the piezoelectric element in a region opposed to the wall portion. The land is electrically connected to the surface electrode. The inkjet head further comprises a printed circuit board on which a terminal electrically connected to the land and a predetermined wiring pattern are provided; and a metallic bond for electrically connecting the land to the terminal. The metallic bond is disposed in at least one of a region between the land and the terminal and a region extending over the land and the terminal along the peripheries of the land and the terminal. The inkjet head further comprises a thermosetting resin covering at least part of the metallic bond.

According to the invention, because the connecting portion between the land and the terminal is in a region not opposed to the pressure chamber, hindrance of deformation of the piezoelectric element can be suppressed. Further, because the metallic bond is covered with the thermosetting resin that has fluidity lower than that of a metallic material even by being heated, movement of the metallic bond can be suppressed. Therefore, by adequately determining the part of the metallic bond with the thermosetting resin, the problems such as hindrance of deformation of a piezoelectric element, rise of the resistance, and braking can be relieved, and/or a short circuit between terminals can be suppressed. For example, by disposing the thermosetting resin in the connecting portion between the land and the main electrode portion of the surface electrode, movement of the metallic bond to the region of the surface electrode opposed to the pressure chamber, i.e., the main electrode portion, can be suppressed, same as the above aspect. This results in relieving the problems such as hindrance of deformation of a piezoelectric element, rise of the resistance, and braking. On the other hand, by disposing the thermosetting resin between neighboring connecting portions between lands and terminals, a short circuit between the terminals can be suppressed.

According to still another aspect of the present invention, an inkjet head comprises an ink passage unit including pressure chambers and a plurality of wall portions defining each of the plurality of pressure chambers; and an actuator unit including a piezoelectric element disposed on the ink passage unit, a surface electrode disposed on the piezoelectric element and having a main electrode portion opposed to a pressure chamber and a connecting portion opposed to a wall portion, and a land disposed on the piezoelectric element in a region opposed to the wall portion. The land is electrically connected to the surface electrode. The inkjet head further comprises a printed circuit board on which a terminal electrically connected to the land and a predetermined wiring pattern are provided; and a thermosetting resin for electrically connecting the land to the terminal. The thermosetting resin is disposed in a region opposed to the wall portion.

According to the invention, because the connecting portion between the land and the terminal is in a region not opposed to the pressure chamber, hindrance of deformation of the piezoelectric element can be suppressed. Further, because not a metallic material but the thermosetting resin is used for electrically connecting the land to the terminal, the problems such as hindrance of deformation of a piezoelectric element, rise of the resistance, braking, and short circuit between terminals, which may happen in case of using a metallic material, can be relieved.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

Figure 1:
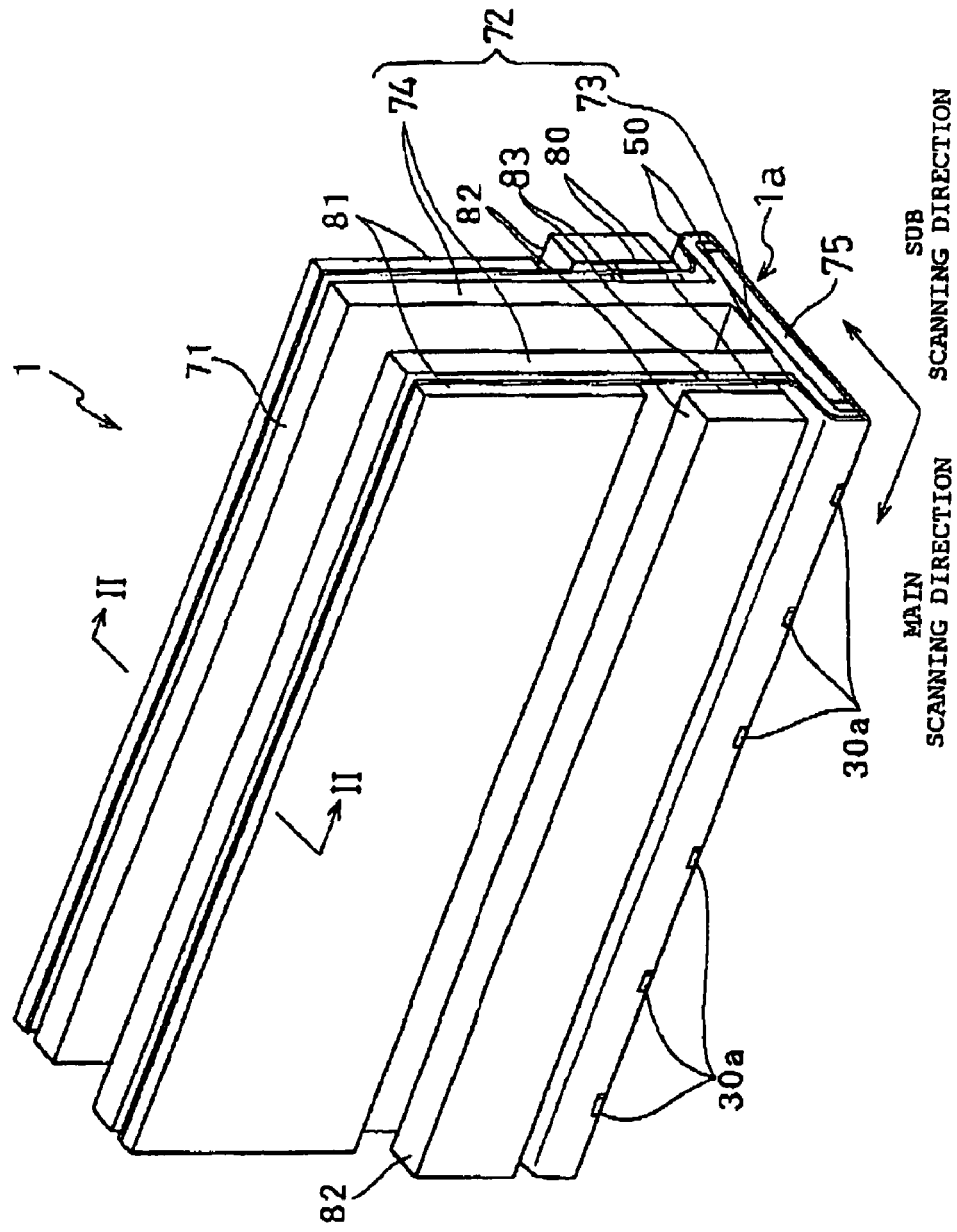
FIG. 1 is a perspective view of an inkjet head according to a first embodiment of the present invention.
Figure 2:
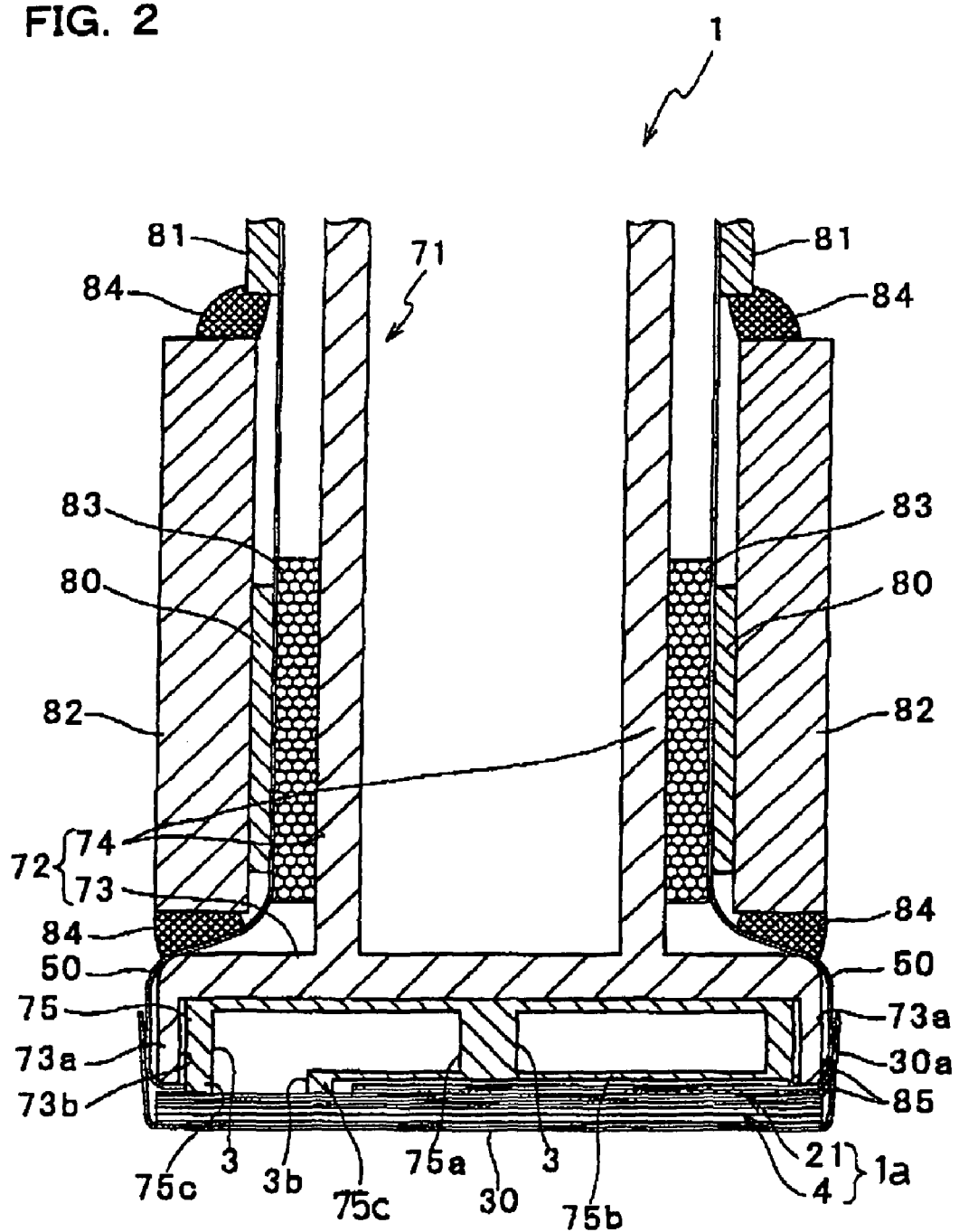
FIG. 2 is a sectional view taken along line II-II in FIG. 1.
Figure 3:
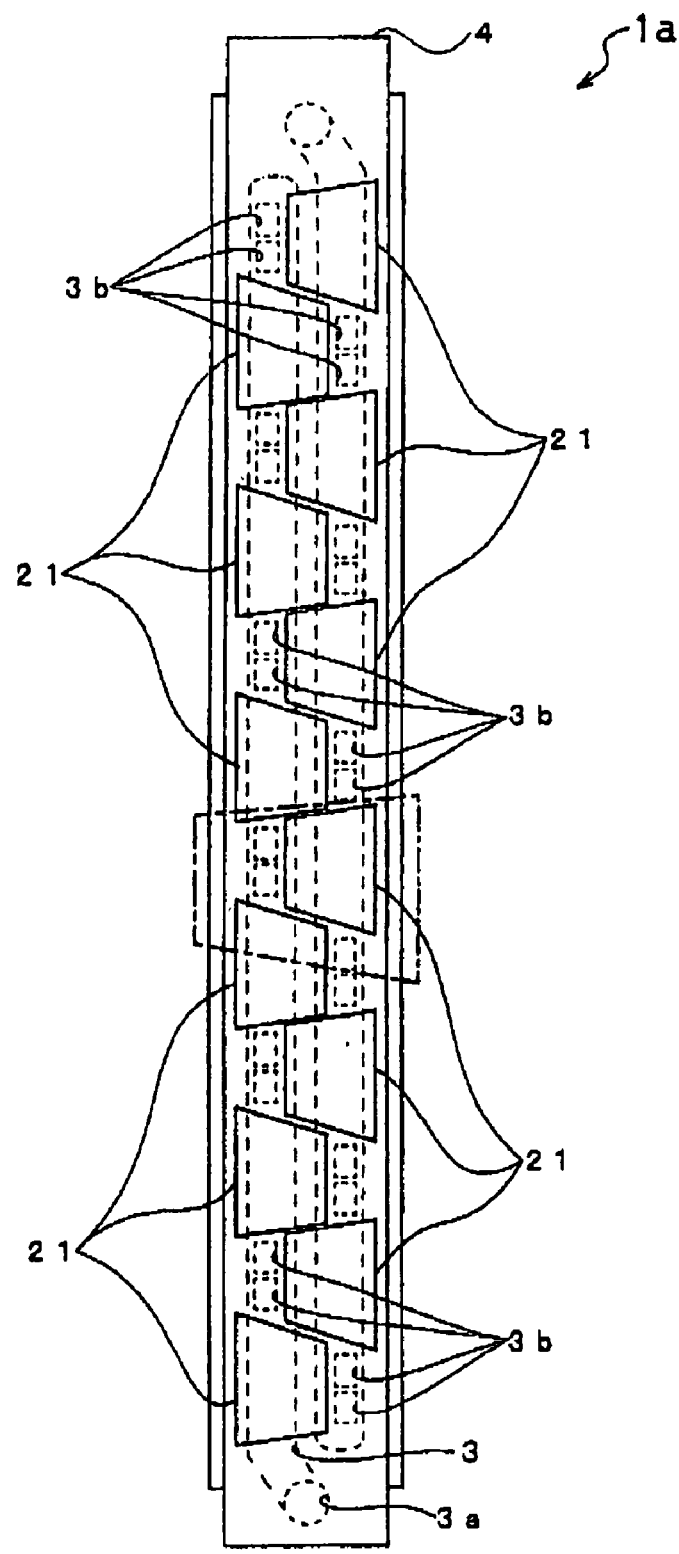
FIG. 3 is a plan view of a head main body included in the inkjet head of FIG. 1.
Figure 10A:
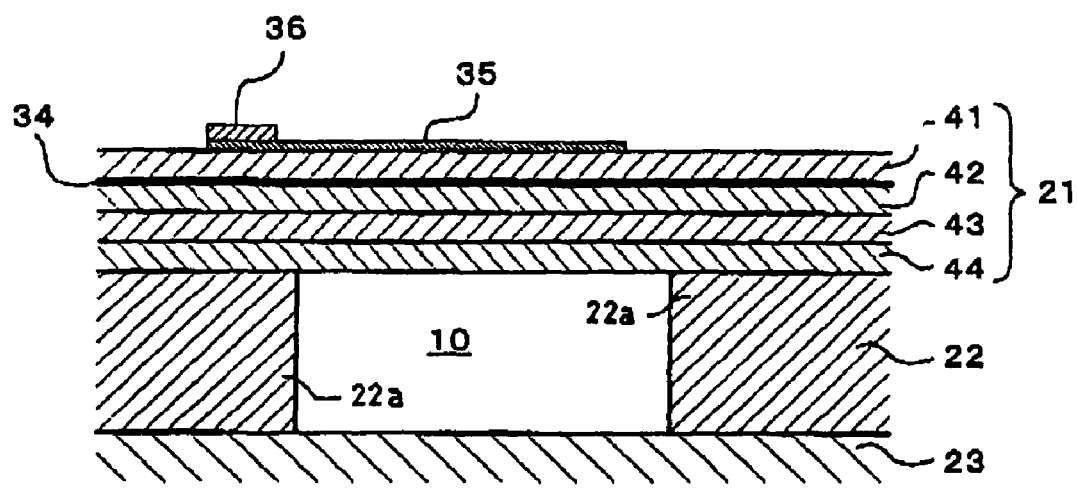
FIG. 10A is a lateral enlarged sectional view of a region enclosed with an alternate long and short dash line in FIG. 6.
Figure 10B:
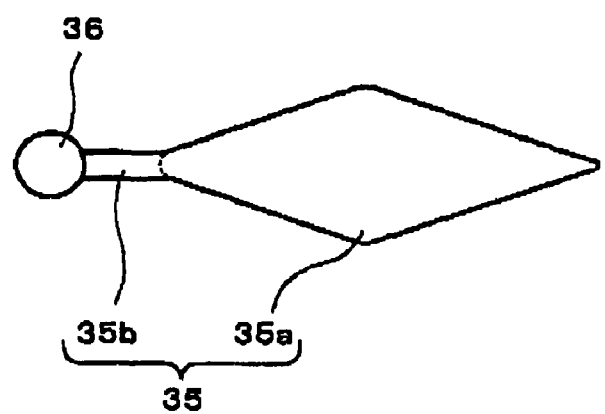
FIG. 10B is a plan view illustrating shapes of an individual electrode, i.e., a surface electrode, formed on a surface of an actuator unit, and a land.

First, a general construction of an inkjet head according to a first embodiment of the present invention will be described with reference to FIG. 1. FIG. 1 is a perspective view of an inkjet head according to this embodiment. FIG. 2 is a sectional view taken along line II-II in FIG. 1. FIG. 3 is a plan view of a head main body included in the inkjet head of FIG. 1. The inkjet head 1 includes a head main body 1a having a rectangular shape in plane and extending in one direction, i.e., main scanning direction, and a base portion 71 for supporting the head main body 1a. The base portion 71 supporting the head main body 1a further supports thereon driver ICs 80 for supplying driving signals to individual electrodes 35, i.e., surface electrodes, as illustrated in FIGS. 10A and 10B, and substrates 81.

Referring to FIG. 1, the base portion 71 is made up of a base block 75 partially bonded to the upper face of the head main body 1a to support the head main body 1a, and a holder 72 bonded to the upper face of the base block 75 to support the base block 75. The base block 75 is a nearly rectangular parallelepiped member having substantially the same length as the head main body 1a. The base block 75 made of a metallic material such as stainless steel has a function as a light structure for reinforcing the holder 72. The holder 72 is made up of a holder main body 73 disposed near the head main body 1a, and a pair of holder support portions 74 each extending on the opposite side of the holder main body 73 to the head main body 1a. Each holder support portion 74 is as a flat member. The holder support portions 74 extend along the length of the holder main body 73 and are disposed parallel to each other at a predetermined interval.

A pair of skirt portions 73a, each protruding downward, are provided in both end portions of the holder main body 73 in a sub scanning direction perpendicular to the main scanning direction. Either skirt portion 73a is formed through the length of the holder main body 73. As a result, in the lower portion of the holder main body 73, a nearly rectangular parallelepiped groove 73b is defined by the pair of skirt portions 73a. The base block 75 is received in the groove 73b. The upper face of the base block 75 is bonded to the bottom of the groove 73b of the holder main body 73 with an adhesive or the like. The thickness of the base block 75 is somewhat larger than the depth of the groove 73b of the holder main body 73. As a result, the lower end of the base block 75 protrudes downward beyond the skirt portions 73a.

Within the base block 75, as passages for ink to be supplied to the head main body 1a, two ink reservoirs 3 are formed as two nearly rectangular parallelepiped spaces, as hollow regions, extending along the length of the base block 75. These two ink reservoirs 3 are separated by a partition 75a extending along the length of the base block 75. As a result, the ink reservoirs 3 extend parallel to each other along the length of the base block 75 at a predetermined interval. In FIG. 2, an opening 3b (see FIG. 3) connecting to an ink reservoir 3 is formed in the left portion of the lower face 75b of the base block 75 at a position corresponding to the ink reservoir 3. Each ink reservoir 3 is connected through a non-illustrated supply tube to a non-illustrated ink tank within the printer main body. Thus, the ink reservoir 3 is suitably supplied with ink from the ink tank.

In the lower face 75b of the base block 75, the vicinity of each opening 3b protrudes downward from the surrounding portion. The head main body 1a supported under the base block 75 includes therein an actuator unit 21 and an ink passage unit 4 bonded to the lower face of the actuator unit 21. The base block 75 is joined with the ink passage unit 4 (see FIG. 2) of the head main body 1a only in the vicinity 75c of each opening 3b of the lower face 75b of the base block 75. Thus, the region of the lower face 75b of the base block 75 other than the vicinity 75c of each opening 3b is distant from the head main body 1a. The actuator unit 21 is disposed within the distance.

A driver IC 80 is fixed to the outer side face of each holder support portion 74 of the holder 72, with an elastic member 83 such as a sponge being interposed between them. A heat sink 82 is disposed in close contact with the outer side face of the driver IC 80. The heat sink 82 is made of a nearly rectangular parallelepiped member for efficiently radiating heat generated in the driver IC 80. A flexible printed circuit (FPC) 50 as a power supply member, as will be described later in detail, is connected to the driver IC 80. The substrate 81 is disposed outside the FPC 50 above the driver IC 80 and the heat sink 82. The upper face of the heat sink 82 is bonded to the substrate 81 with a seal member 84. Also, the lower face of the heat sink 82 is bonded to the FPC 50 with a seal member 84. In order that a driving signal output from the driver IC 80 can be transmitted to any individual electrode 35 (see FIGS. 10A and 10B) formed on a surface of the actuator unit 21 as will be described later in detail, the FPC 50 is electrically connected to both of the driver IC 80 and the individual electrodes 35.

Between the lower face of each skirt portion 73a of the holder main body 73 and the upper face of the ink passage unit 4, a seal member 85 is disposed to sandwich the FPC 50. Thus, the FPC 50 is fixed with the seal member 85 to the ink passage unit 4 and the holder main body 73. Therefore, even if the head main body 1a is elongated, the head main body 1a can be prevented from being bent, the interconnecting portion between the FPC 50 and each individual electrode 35 (see FIGS. 10A and 10B) formed on the surface of the actuator unit 21 can be prevented from receiving stress, and the FPC 50 can surely be held.

Referring to FIG. 1, in the vicinity of each lower corner of the inkjet head 1 along the main scanning direction, six protruding portions 30a are disposed at regular intervals along the corresponding side wall of the inkjet head 1. These protruding portions 30a are provided at both ends in the sub scanning direction of a nozzle plate 30 (see FIG. 6) in the lowermost layer of the head main body 1a. The nozzle plate 30 is bent by about 90 degrees along the boundary line between each protruding portion 30a and the other portion. The protruding portions 30a are provided at positions corresponding to the vicinities of both ends of various sizes of papers to be used for printing. Each bent portion of the nozzle plate 30 has a shape not right-angled but rounded. This makes it hard to bring about clogging of a paper, i.e., jamming, which may occur because the leading edge of the paper, which has been transferred to approach the head 1, is stopped by the side face of the head 1.

In FIG. 3, an ink reservoir 3 formed in the base block 75 is imaginarily illustrated with a broken line. As illustrated in FIG. 3, the head main body 1a has a rectangular shape in plane extending in one direction, i.e., main scanning direction. The head main body 1a includes therein an ink passage unit 4 in which a large number of pressure chambers 10 and a large number of ink ejection ports 8 at the front ends of nozzles (as for both, see FIGS. 5 and 6), as will be described later. Trapezoidal actuator units 21 arranged in two rows in a zigzag manner are bonded to the upper face of the ink passage unit 4. Each actuator unit 21 is disposed such that its parallel opposed sides, i.e., its upper and lower sides, extend along the length of the ink passage unit 4. The oblique sides of each neighboring actuator units 21 overlap each other in the width of the ink passage unit 4.

Each region in the lower face of the ink passage unit 4 corresponding to the region where an actuator unit 4 is bonded is an ink ejection region. In the surface of each ink ejection region, a large number of ink ejection ports 8 are arranged in a matrix, as will be described later. Within the base block 75 disposed above the ink passage unit 4, the ink reservoirs 3 are formed along the length of the base block 75. Each ink reservoir 3 is connected to a non-illustrated ink tank through the opening 3a provided at one end of the ink reservoir 3, so that the ink reservoir 3 is always filled up with ink. In each ink reservoir 3, pairs of openings 3b are provided in regions where no actuator unit 21 is present, so as to be arranged in a zigzag manner along the length of the ink reservoir 3.

Figure 4:
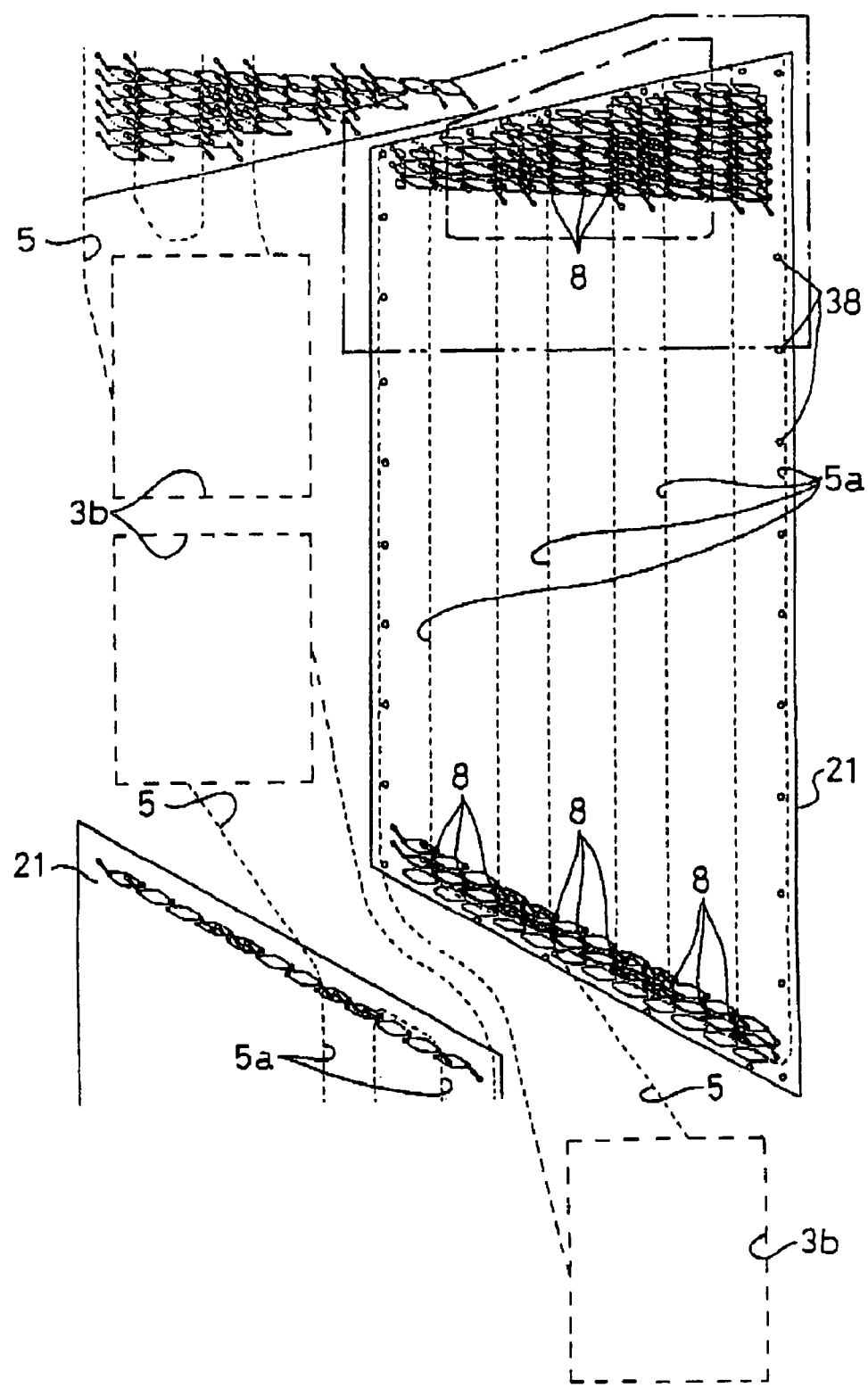
FIG. 4 is an enlarged view of a region enclosed with an alternate long and short dash line in FIG. 3.

FIG. 4 is an enlarged view of a region enclosed with an alternate long and short dash line in FIG. 3. As illustrated in FIGS. 3 and 4, each ink reservoir 3 is connected through an opening 3b to a manifold channel 5 within the ink passage unit 4 disposed under the opening 3b. Each opening 3b is provided with a non-illustrated filter for catching dust and dirt contained in ink. The front end portion of each manifold channel 5 branches into two sub manifold channels 5a. In the lower portion of one actuator unit 21, two sub manifold channels 5a extend from each of the two openings 3b on both sides of the actuator unit 21 in the length of the inkjet head 1. That is, in the lower portion of one actuator unit 21, four sub manifold channels 5a in total extend along the length of the inkjet head 1. Each sub manifold channel 5a is filled up with ink supplied from the corresponding ink reservoir 3.

Figure 5:
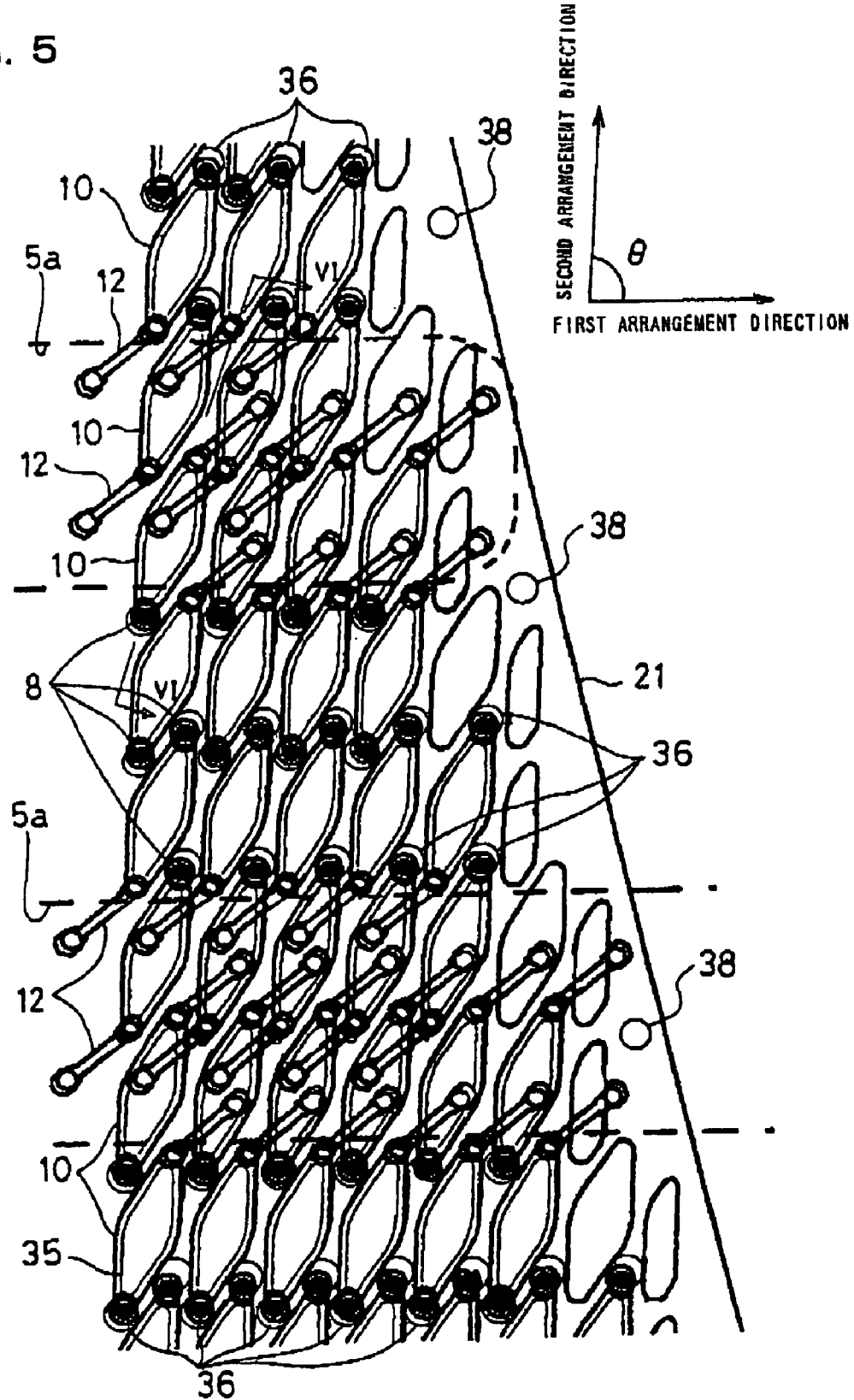
FIG. 5 is an enlarged view of a region enclosed with an alternate long and short dash line in FIG. 4.

FIG. 5 is an enlarged view of a region enclosed with an alternate long and short dash line in FIG. 4. Either of FIGS. 4 and 5 is a vertical view of a plane in which many pressure chambers 10 are arranged in a matrix in the ink passage unit 4. Pressure chambers 10, apertures 12, nozzles (ink ejection ports 8 formed at the respective tips of the nozzles are only illustrated in FIGS. 4 and 5), sub manifold channels 5a, etc., as components of the ink passage unit 4, are disposed at different levels from one another perpendicularly to FIGS. 4 and 5 (see FIG. 6).

In FIGS. 4 and 5, to make it easy to understand the figures, the pressure chambers 10, the apertures 12, etc., are illustrated with solid lines though they should be illustrated with broken lines because they are within the actuator unit 21 or ink passage unit 4.

As illustrated in FIGS. 4 and 5, many ground electrodes 38 as peripheral electrodes each having a circular shape are provided near the outer edges of the upper face of each actuator unit 21. The ground electrodes 38 are arranged substantially at regular intervals. Thus, the region of the surface of the actuator unit 21 where individual electrodes 35 (see FIGS. 10A and 10B) are formed is entirely surrounded by the ground electrodes 38.

Figure 6:
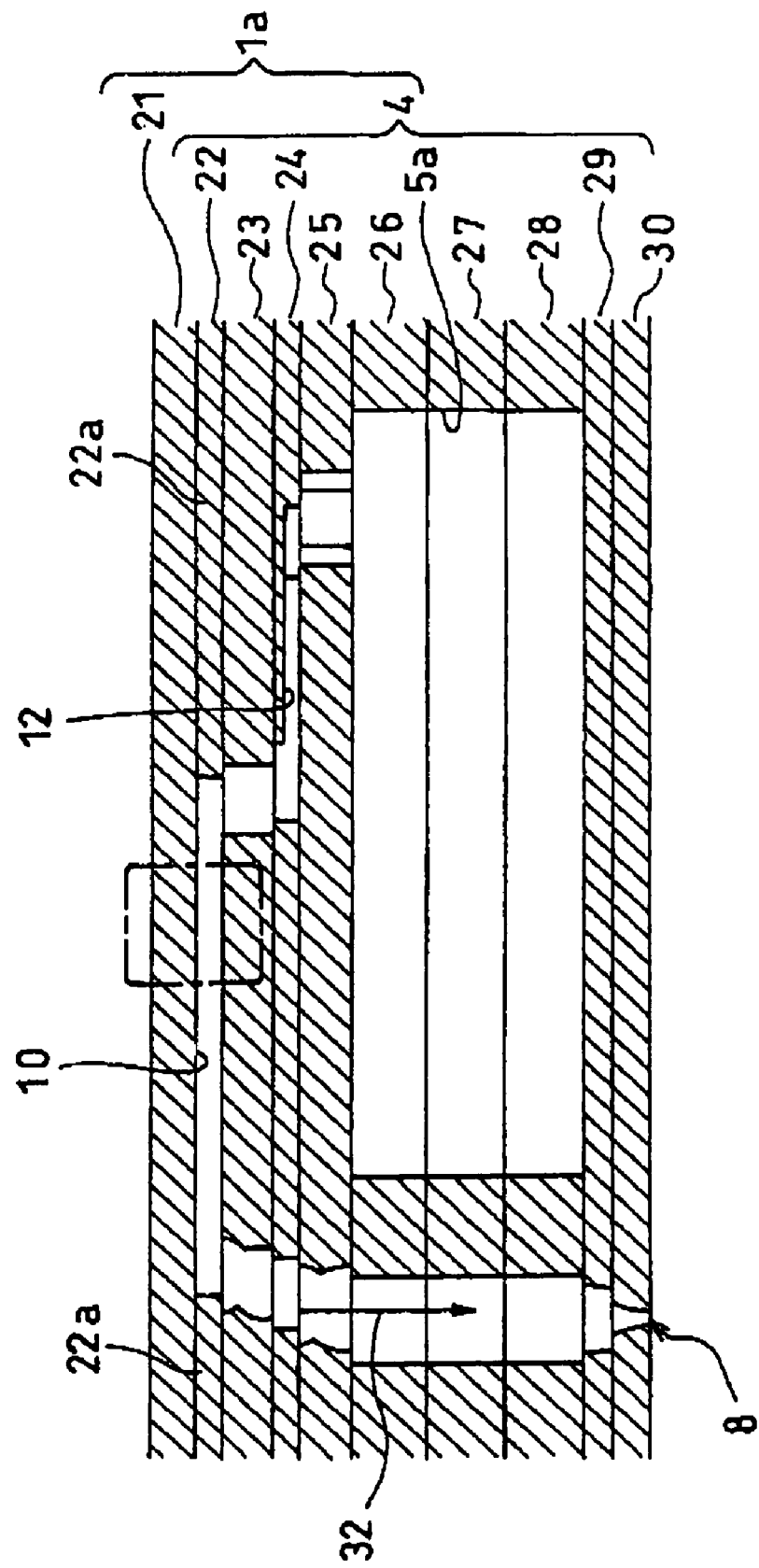
FIG. 6 is a partial sectional view of the head main body of FIG. 3 taken along line VI-VI in FIG. 5.

FIG. 6 is a partial sectional view of the head main body 1a of FIG. 3 taken along line VI-VI in FIG. 5. As apparent from FIG. 6, each ink ejection port 8 is formed at the tip end of a tapered nozzle. Between a pressure chamber 10 and a sub manifold channel 5a, an aperture 12 extends substantially parallel to the surface of the ink passage unit 4, like the pressure chamber 10. The aperture 12 is for restricting the ink flow to give the passage a suitable resistance, thereby intending the stabilization of ink ejection. Each ink ejection port 8 is connected to a sub manifold channel 5a through a pressure chamber 10 (length: 900 micrometer, width: 350 micrometer) and an aperture 12. Thus, within the inkjet head 1 formed are ink passages 32 each extending from a non-illustrated ink tank to an ink ejection port 8 through an ink reservoir 3, a manifold channel 5, a sub manifold channel 5a, an aperture 12, and a pressure chamber 10.

As apparent from FIG. 6, any aperture 12 is provided at a level different from that of the corresponding pressure chamber 10. Therefore, within a region of the ink passage unit 4 corresponding to the in ejection region under each actuator unit 21, the aperture 12 and sub manifold channel 5a connected to one pressure chamber 10 can be disposed to overlap in plane a pressure chamber 10 neighboring the above one pressure chamber 10. As a result, because pressure chambers 10 can be densely arranged close to each other, image printing at a high resolution can be realized with an inkjet head 1 having a relatively small occupation area.

In the plane of FIGS. 4 and 5, pressure chambers 10 are arranged within an ink ejection region in two directions, i.e., a direction along the length of the inkjet head 1 (first arrangement direction) and a direction somewhat oblique to the width of the inkjet head 1 (second arrangement direction). The first and second arrangement directions form an angle theta somewhat smaller than the right angle. The ink ejection ports 8 are arranged at 50 dpi in the first arrangement direction. On the other hand, the pressure chambers 10 are arranged in the second arrangement direction such that the ink ejection region corresponding to one actuator unit 21 includes twelve pressure chambers 10. The shift to the first arrangement direction due to the arrangement in which twelve pressure chambers 10 are arranged in the second arrangement direction, corresponds to one pressure chamber 10. Therefore, within the whole width of the inkjet head 1, in a region of the interval between two ink ejection ports 8 neighboring each other in the first arrangement direction, there are twelve ink ejection ports 8. At both ends of each ink ejection region in the first arrangement direction, corresponding to an oblique side of the actuator unit 21, the above condition is satisfied by making a compensation relation to the ink ejection region corresponding to the opposite actuator unit 21 in the width of the inkjet head 1. Therefore, in the inkjet head 1 according to this embodiment, by ejecting ink droplets in order through a large number of ink ejection ports 8 arranged in the first and second arrangement directions with relative movement of a print paper along the width of the inkjet head 1, printing at 600 dpi in the main scanning direction can be performed.

Next, the construction of the ink passage unit 4 will be described in more detail with reference to FIG. 7. Referring to FIG. 8, pressure chambers 10 are arranged in rows in the first arrangement direction at predetermined intervals at 500 dpi. Twelve rows of pressure chambers 10 are arranged in the second arrangement direction. As the whole, the pressure chambers 10 are two-dimensionally arranged in the ink ejection region corresponding to one actuator unit 21.

Figure 7:
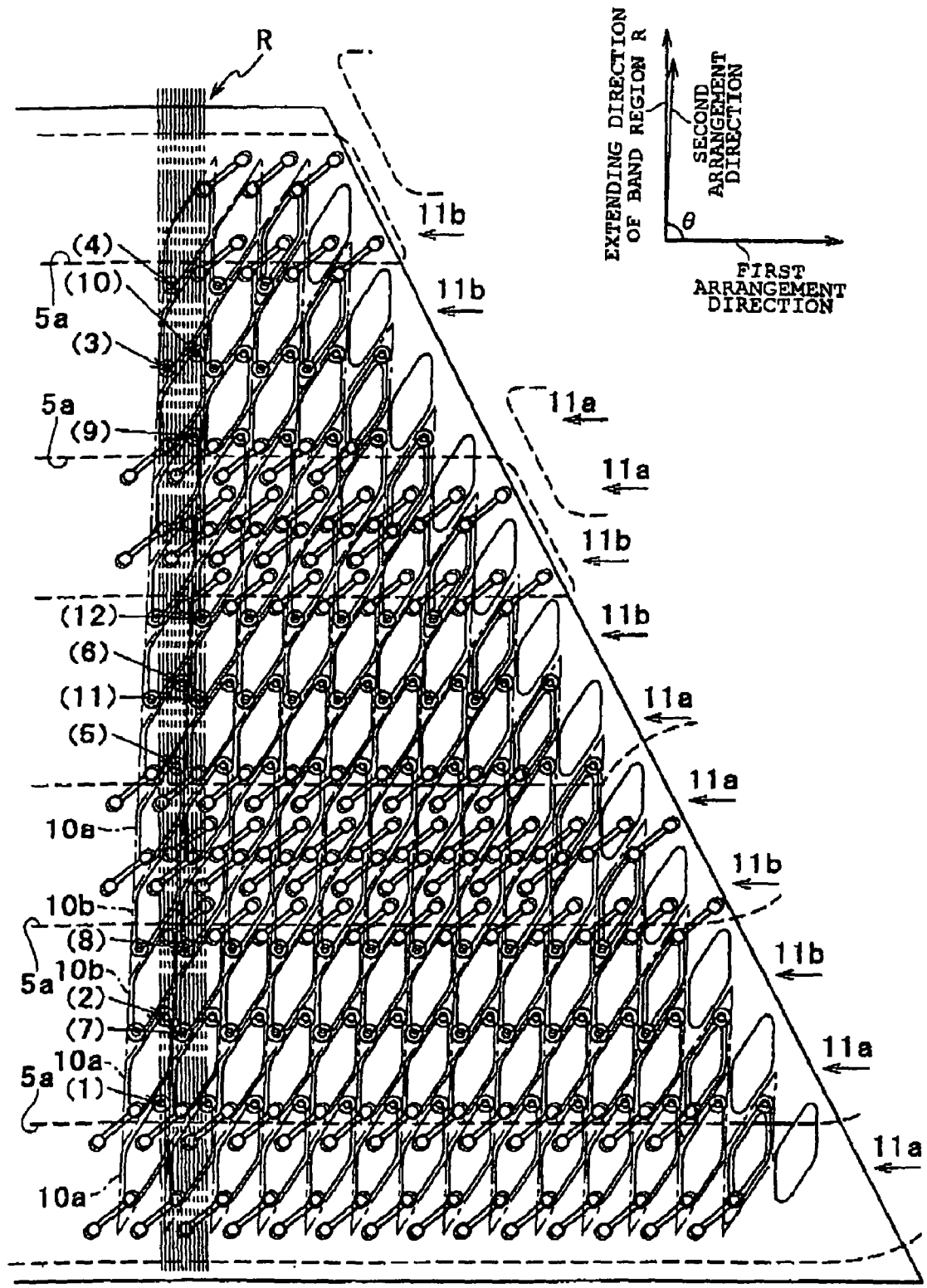
FIG. 7 is an enlarged view of a region enclosed with an alternate long and two short dashes line in FIG. 4.
Figure 8:
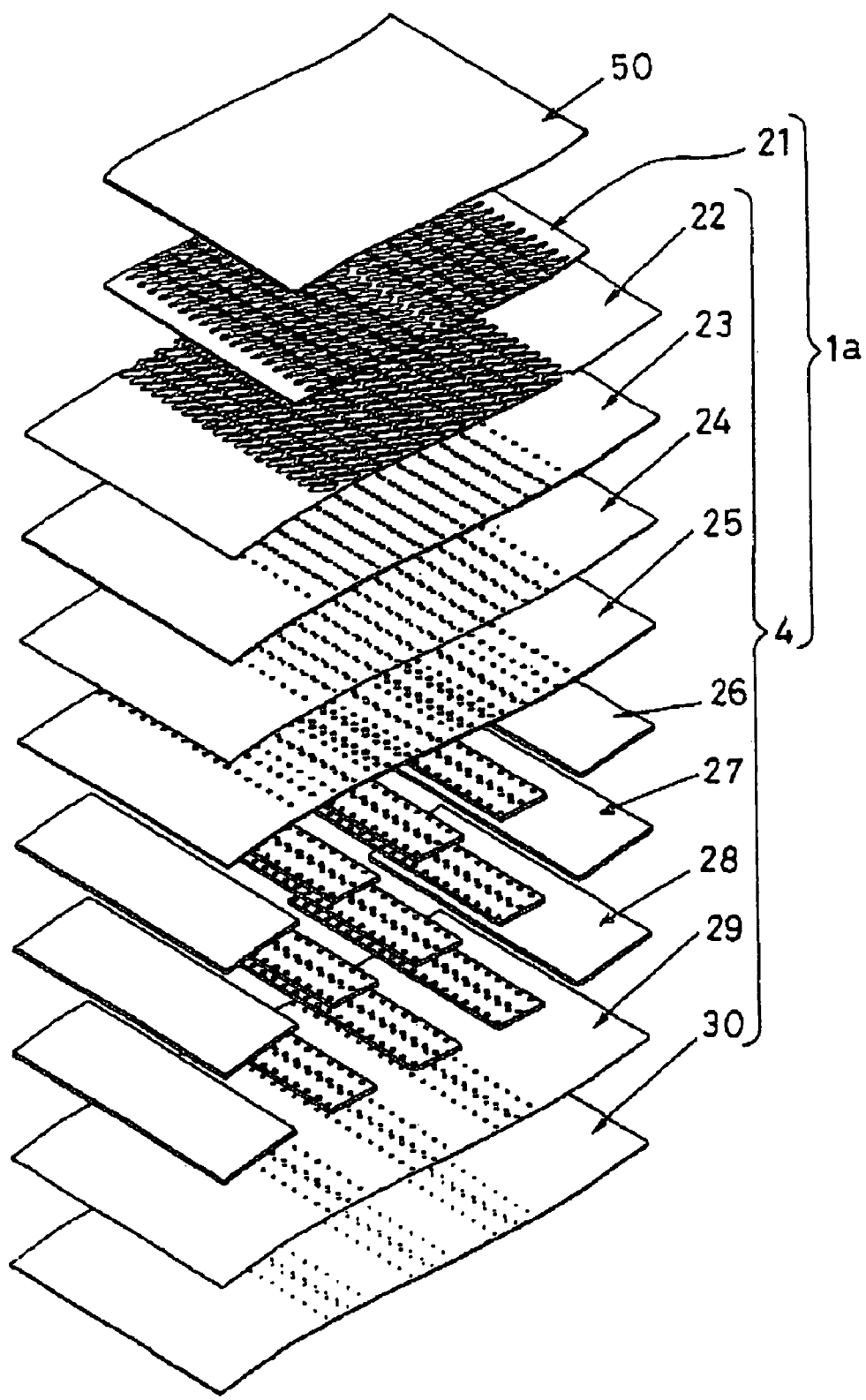
FIG. 8 is a partial exploded perspective view of the head main body of FIG. 6 and a flexible printed circuit board bonded to the head main body.

The pressure chambers 10 are classified into two kinds, i.e., pressure chambers 10a in each of which a nozzle is connected to the upper acute portion in FIG. 7, and pressure chambers 10b in each of which a nozzle is connected to the lower acute portion. Pressure chambers 10a and 10b are arranged in the first arrangement direction to form pressure chamber rows 11a and 11b, respectively. As illustrated in FIG. 7, in the ink ejection region corresponding to one actuator unit 21, from the lower side of FIG. 7, there are disposed two pressure chamber rows 11a and two pressure chamber rows 11b neighboring the upper side of the pressure chamber rows 11a. The four pressure chamber rows of the two pressure chamber rows 11a and the two pressure chamber rows 11b constitute a set of pressure chamber rows. Such a set of pressure chamber rows is repeatedly arranged three times from the lower side in the ink ejection region corresponding to one actuator unit 21. A straight line extending through the upper acute portion of each pressure chamber in each of pressure chamber rows 11a and 11b crosses the lower oblique side of each pressure chamber in the pressure chamber row neighboring the upper side of that pressure chamber row.

As described above, when viewing perpendicularly to FIG. 7, two first pressure chamber rows 11a and two second pressure chamber rows 11b, in which nozzles connected to pressure chambers 10 are disposed at different positions, are arranged alternately to neighbor each other. Consequently, as the whole, the pressure chambers 10 are arranged regularly. On the other hand, nozzles are arranged in a concentrated manner in a central region of each set of pressure chamber rows constituted by the above four pressure chamber rows. Therefore, in case that each four pressure chamber rows constitute a set of pressure chamber rows and such a set of pressure chamber rows is repeatedly arranged three times from the lower side, as described above, there is formed a region where no nozzles exist, in the vicinity of the boundary between each neighboring sets of pressure chamber rows, i.e., on both sides of each set of pressure chamber rows constituted by four pressure chamber rows. Wide sub manifold channels 5a extend there for supplying ink to the corresponding pressure chambers 10. In this embodiment, in the ink ejection region corresponding to one actuator unit 21, four wide sub manifold channels 5a in total are arranged in the first arrangement direction, i.e., one on the lower side of FIG. 7, one between the lowermost set of pressure chamber rows and the second lowermost set of pressure chamber rows, and two on both sides of the uppermost set of pressure chamber rows.

As illustrated in FIG. 7, nozzles connected to ink ejection ports 8 for ejecting ink are arranged in the first arrangement direction at regular intervals at 50 dpi to correspond to the respective pressure chambers 10 regularly arranged in the first arrangement direction. On the other hand, while twelve pressure chambers 10 are regularly arranged also in the second arrangement direction forming an angle theta with the first arrangement direction, twelve nozzles corresponding to the twelve pressure chambers 10 include ones each connected to the upper acute portion of the corresponding pressure chamber 10 and ones each connected to the lower acute portion of the corresponding pressure chamber 10, as a result, they are not regularly arranged in the second arrangement direction at regular intervals.

If all nozzles are connected to the same-side acute portions of the respective pressure chambers 10, the nozzles are regularly arranged also in the second arrangement direction at regular intervals. In this case, nozzles are arranged so as to shift in the first arrangement direction by a distance corresponding to 600 dpi as resolution upon printing per pressure chamber row from the lower side to the upper side of FIG. 7. Contrastingly in this embodiment, because four pressure chamber rows of two pressure chamber rows 11a and two pressure chamber rows 11b constitute a set of pressure chamber rows and such a set of pressure chamber rows is repeatedly arranged three times from the lower side, the shift of nozzle position in the first arrangement direction per pressure chamber row from the lower side to the upper side of FIG. 7 is not always the same.

In the inkjet head 1 of this embodiment, a band region R will be discussed that has a width of about 508.0 micrometer corresponding to 50 dpi in the first arrangement direction and extends perpendicularly to the first arrangement direction. In the band region R, any of twelve pressure chamber rows includes only one nozzle. That is, when such a band region R is defined at an arbitrary position in the ink ejection region corresponding to one actuator unit 21, twelve nozzles are always distributed in the band region R. The positions of points respectively obtained by projecting the twelve nozzles onto a straight line extending in the first arrangement direction are distant from each other by a distance corresponding to 600 dpi as resolution upon printing.

When the twelve nozzles included in one band region R are denoted by (1) to (12) in order from one whose projected image onto a straight line extending in the first arrangement direction is the leftmost, the twelve nozzles are arranged in the order of (1), (7), (2), (8), (5), (11), (6), (12), (9), (3), (10), and (4) from the lower side.

In the thus-constructed inkjet head 1 of this embodiment, by properly driving active portions in the actuator unit 21, a character, an figure, or the like, having a resolution of 600 dpi can be formed. That is, by selectively driving active portions corresponding to the twelve pressure chamber rows in order in accordance with the transfer of a print medium, a specific character or figure can be printed on the print medium.

By way of example, a case will be described wherein a straight line extending in the first arrangement direction is printed at a resolution of 600 dpi. First, a case will be briefly described wherein nozzles are connected to the same-side acute portions of pressure chambers 10. In this case, in accordance with transfer of a print medium, ink ejection starts from a nozzle in the lowermost pressure chamber row in FIG. 7. Ink ejection is then shifted upward with selecting a nozzle belonging to the upper neighboring pressure chamber row in order. Ink dots are thereby formed in order in the first arrangement direction with neighboring each other at 600 dpi. Finally, all the ink dots form a straight line extending in the first arrangement direction at a resolution of 600 dpi.

On the other hand, in this embodiment, ink ejection starts from a nozzle in the lowermost pressure chamber row 11a in FIG. 7, and ink ejection is then shifted upward with selecting a nozzle connected to the upper neighboring pressure chamber row in order in accordance with transfer of a print medium. In this embodiment, however, because the positional shift of nozzles in the first arrangement direction per pressure chamber row from the lower side to the upper side is not always the same, ink dots formed in order in the first arrangement direction in accordance with the transfer of the print medium are not arranged at regular intervals at 600 dpi.

More specifically, as shown in FIG. 7, in accordance with the transfer of the print medium, ink is first ejected through a nozzle (1) connected to the lowermost pressure chamber row 11a in FIG. 7 to form a dot row on the print medium at intervals of about 508.0 micrometer corresponding to 50 dpi. After this, as the print medium is transferred and the straight line formation position has reached the position of a nozzle (7) connected to the second lowermost pressure chamber row 11a, ink is ejected through the nozzle (7). The second ink dot is thereby formed at a position shifted from the first formed dot position in the first arrangement direction by a distance of six times the interval of about 42.3 micrometer corresponding to 600 dpi (about 42.3 micrometer multiplied by six makes about 254.0 micrometer).

Next, as the print medium is further transferred and the straight line formation position has reached the position of a nozzle (2) connected to the third lowermost pressure chamber row 11b, ink is ejected through the nozzle (2). The third ink dot is thereby formed at a position shifted from the first formed dot position in the first arrangement direction by a distance of the interval of about 42.3 micrometer corresponding to 600 dpi. As the print medium is further transferred and the straight line formation position has reached the position of a nozzle (8) connected to the fourth lowermost pressure chamber row 11b, ink is ejected through the nozzle (8). The fourth ink dot is thereby formed at a position shifted from the first formed dot position in the first arrangement direction by a distance of seven times the interval of about 42.3 micrometer corresponding to 600 dpi (about 42.3 micrometer multiplied by seven makes about 296.3 micrometer). As the print medium is further transferred and the straight line formation position has reached the position of a nozzle (5) connected to the fifth lowermost pressure chamber row 11a, ink is ejected through the nozzle (5). The fifth ink dot is thereby formed at a position shifted from the first formed dot position in the first arrangement direction by a distance of four times the interval of about 42.3 micrometer corresponding to 600 dpi (about 42.3 micrometer multiplied by four makes about 169.3 micrometer).

Afterward, in the same manner, ink dots are formed with selecting nozzles connected to pressure chambers 10 in order from the lower side to the upper side in FIG. 7. In this case, when the number of a nozzle in FIG. 7 is N, an ink dot is formed at a position shifted from the first formed dot position in the first arrangement direction by a distance corresponding to (magnification n=N−1) multiplied by (interval corresponding to 600 dpi). When the twelve nozzles have been finally selected, the gap between the ink dots to be formed by the nozzles (1) in the lowermost pressure chamber rows 11a in FIG. 7 at an interval of about 508.0 micrometer corresponding to 50 dpi is filled up with eleven dots formed at intervals of about 42.3 micrometer corresponding to 600 dpi. Therefore, as the whole, a straight line extending in the first arrangement direction can be drawn at a resolution of 600 dpi.

FIG. 8 is a partial exploded view of the head main body 1a of FIG. 6 and the FPC 50 bonded to the head main body 1a. As illustrated in FIG. 8, a principal portion on the bottom side of the inkjet head 1 has a layered structure laminated with eleven sheets in total, i.e., from the top, an FPC 50, an actuator unit 21, a cavity plate 22, a base plate 23, an aperture plate 24, a supply plate 25, manifold plates 26, 27, and 28, a cover plate 29, and a nozzle plate 30. Of them, nine plates 22 to 30 other than the FPC 50 and the actuator unit 21 constitute an ink passage unit 4.

As will be described later in detail, the actuator unit 21 is laminated with four piezoelectric sheets and provided with electrodes so that one layer of the piezoelectric sheets includes portions to be active portions when an electric field is applied, and the remaining three layers are inactive layers. The cavity plate 22 is made of metal, in which a large number of substantially rhombic openings are formed corresponding to the respective pressure chambers 10. Portions except the openings of the cavity plate 22 constitutes wall portions 22a defining each of the pressure chambers 10. The base plate 23 is made of metal, in which a connecting hole between each pressure chamber 10 of the cavity plate 22 and the corresponding aperture 12, and a connecting hole between the pressure chamber 10 and the corresponding ink ejection port 8 are formed. The aperture plate 24 is made of metal, in which, in addition to apertures 12, connecting holes are formed for connecting each pressure chamber 10 of the cavity plate 22 to the corresponding ink ejection port 8. The supply plate 25 is made of metal, in which connecting holes between each aperture 12 and the corresponding sub manifold channel 5a and connecting holes for connecting each pressure chamber 10 of the cavity plate 22 to the corresponding ink ejection port 8 are formed. Each of the manifold plates 26, 27, and 28 is made of metal, which defines an upper portion of each sub manifold channel Sa and in which connecting holes are formed for connecting each pressure chamber 10 of the cavity plate 22 to the corresponding ink ejection port 8. The cover plate 29 is made of metal, in which connecting holes are formed for connecting each pressure chamber 10 of the cavity plate 22 to the corresponding ink ejection port 8. The nozzle plate 30 is made of metal, in which tapered ink ejection ports 8 each functioning as a nozzle are formed for the respective pressure chambers 10 of the cavity plate 22.

The ink passage 32 of FIG. 6 first extends upward from the sub manifold channel 5a, then extends horizontally in the aperture 12, then further extends upward, then again extends horizontally in the pressure chamber 10, then extends obliquely downward in a certain length to get apart from the aperture 12, and then extends vertically downward toward the ink ejection port 8.

Figure 9A:
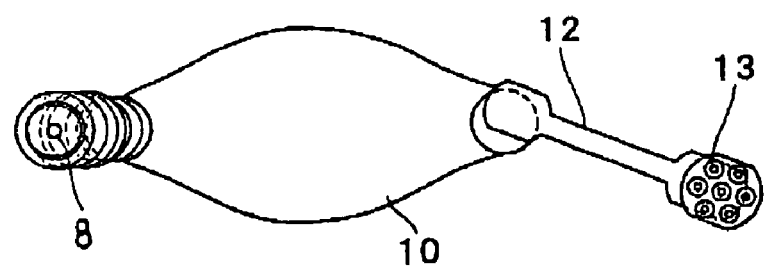
FIG. 9A is a plan view illustrating the shape of a space forming an ink passage of FIG. 6.
Figure 9B:
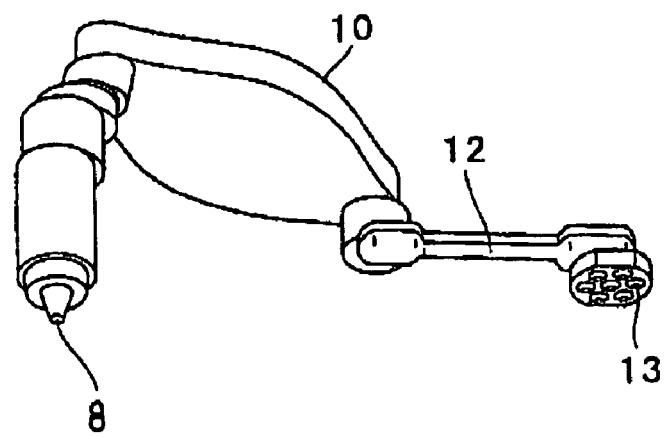
FIG. 9B is a perspective view illustrating the shape of the space forming the ink passage of FIG. 6.

FIGS. 9A and 9B are plan and perspective views illustrating the shape of the space forming the ink passage of FIG. 6, respectively. FIGS. 9A and 9B illustrates therein a filter 13 provided at the interface between an aperture 12 and a sub manifold channel 5a. The filter 13 is for removing dust contained in ink.

Next, the construction of an actuator unit 21 will be described with reference to FIGS. 10A and 10B. FIG. 10A is a lateral enlarged sectional view of a region enclosed with an alternate long and short dash line in FIG. 6. FIG. 10B is a plan view illustrating shapes of an individual electrode formed on a surface of an actuator unit 21, and a land.

As illustrated in FIG. 10A, an actuator unit 21 includes therein four piezoelectric sheets 41, 42, 43, and 44 having the same thickness of about 15 micrometer. The piezoelectric sheets 41 to 44 constitute a piezoelectric element and are made into a continuous layered flat plate (continuous flat layers) that is disposed so as to extend over many pressure chambers 10 formed within one ink ejection region in the inkjet head 1. Thereby, the mechanical rigidity of the piezoelectric sheets 41 to 44 can be kept high. Because the piezoelectric sheets 41 to 44 are disposed so as to extend over many pressure chambers 10 as the continuous flat layers, individual electrodes 35 can be arranged at a high density by using, e.g., a screen printing technique. Therefore, also pressure chambers 10 (see FIGS. 10A and 10B) formed at positions corresponding to main electrode portion s 35a of the individual electrodes 35 as will be described later can be arranged at a high density. This makes it possible to print a high-resolution image.

In this embodiment, each of the piezoelectric sheets 41 to 44 is made of a lead zirconate titanate (PZT)-base ceramic material having ferroelectricity.

As illustrated in FIG. 10A, about 1 micrometer-thick individual electrodes 35, each having a shape in plane as illustrated in FIG. 10B, are formed on the upper face of the uppermost piezoelectric sheet 41 at positions corresponding to the respective pressure chambers 10. An about 2 micrometer-thick common electrode 34 is interposed between the piezoelectric sheet 41 and the piezoelectric sheet 42 neighboring downward the piezoelectric sheet 41. The common electrode 34 is made of a single conductive sheet extending substantially in the whole region of one actuator unit 21. Each of the electrodes 34 and 35 is made of a metallic material of, e.g., an Ag—Pd-base alloy.

No electrode is provided between the piezoelectric sheet 42 and the piezoelectric sheet 43 neighboring downward the piezoelectric sheet 42, between the piezoelectric sheet 43 and the piezoelectric sheet 44 neighboring downward the piezoelectric sheet 43, and on the lower face of the piezoelectric sheet 44.

In a modification, many common electrodes 34 each having a shape larger than that of a pressure chamber 10 so that the projection image of each common electrode projected along the thickness of the common electrode includes the pressure chamber, may be provided for each pressure chamber 10. In another modification, many common electrodes 34 each having a shape somewhat smaller than that of a pressure chamber 10 so that the projection image of each common electrode projected along the thickness of the common electrode is included in the pressure chamber, may be provided for each pressure chamber 10. Thus, the common electrode 34 may not always be a single conductive sheet formed on the whole of the face of a piezoelectric sheet. In the above modifications, however, all the common electrodes must be electrically connected to one another so that the portion corresponding to any pressure chamber 10 is at the same potential.

As illustrated in FIG. 10B, each individual electrode 35 has a nearly rhombic shape having a length of 850 micrometer and a width of 250 micrometer in plane, substantially similar to that of the pressure chamber 10 as illustrated in FIG. 5. The individual electrode 35 includes therein a main electrode portion 35a opposed to the pressure chamber 10, and a connecting portion 35b extending from one acute corner of the main electrode portion 35a to be opposed to the wall portion 22a and not to be opposed to the pressure chamber 10. A circular land 36 having a diameter of about 160 micrometer is provided on the end of the connecting portion 35b opposite to the main electrode portion 35a. The land 36 is made of, e.g., gold containing glass frit. The land 36 is electrically connected to the individual electrode 35.

As illustrated in FIGS. 10A and 5, when viewing along the thickness of the piezoelectric sheets 41 to 44, the projection image of the main electrode portion 35a of each individual electrode 35 is included in the corresponding pressure chamber 10 but the projection image of the land 36 is not included in the pressure chamber 10. Both of the land 36 and the connecting portion 35b of each individual electrode 35 are opposed to the wall portion 22a.

The common electrode 34 as illustrated in FIG. 10A is electrically connected to a ground electrode 38 as illustrated in FIG. 5 through a non-illustrated through-hole formed in the piezoelectric sheet 41. Any ground electrode 38 is formed on the upper face of the piezoelectric sheet 41. The FPC 50 includes therein not only conductive patterns 53 as will be described later (see FIGS. 11A to 11C) but also non-illustrated conductive patterns as wires for grounding. When non-illustrated ground terminals provided in the latter conductive patterns are connected to the respective ground electrodes 38, the common electrode 34 connected to the ground electrodes 38 is kept at the ground potential in the region corresponding to all pressure chambers 10.

Next, drive of the actuator unit 21 of this embodiment will be described. The piezoelectric sheets 41 to 44 of the actuator unit 21 have been polarized in their thickness. Therefore, an individual electrode 35 is set at a potential different from that of the common electrode 34 to apply an electric field to the piezoelectric sheet 41 in the polarization, the portion of the piezoelectric sheet 41 to which the electric field has been applied works as an active portion and the portion is ready to expand or contract in thickness, i.e., in layers, and to contract or expand perpendicularly to the thickness, i.e., in a plane, by the transversal piezoelectric effect. On the other hand, because the remaining three piezoelectric sheets 42 to 44 are inactive layers having no regions sandwiched by the individual electrode 35 and the common electrode 34, they can not be deformed in their selves. That is, the actuator unit 21 has a so-called unimorph type structure in which the upper, i.e., distant from the pressure chamber 10, one piezoelectric sheet 41 is a layer including active portions and the lower, i.e., near the pressure chamber 10, three piezoelectric sheets 42 to 44 are inactive layers.

Therefore, when the driver IC 80 is controlled so that an electric field is produced in the same direction as the polarization and an individual electrode 35 is set at a positive or negative predetermined potential relative to the common electrode 34, the active portion in the piezoelectric sheet 41 sandwiched by the individual and common electrodes 35 and 34 contracts in a plane, while the piezoelectric sheets 42 to 44 do not contract in their selves. At this time, as illustrated in FIG. 10A, the lowermost face of the piezoelectric sheets 41 to 44 is fixed to the upper face of partitions partitioning pressure chambers 10 formed in the cavity plate 22, as a result, the piezoelectric sheets 41 to 44 are deformed into a convex shape toward the corresponding pressure chamber 10 by contracting in a plane by the transversal piezoelectric effect, which is called unimorph deformation. Therefore, the volume of the pressure chamber 10 is decreased to raise the pressure of ink. The ink is thereby ejected through the corresponding ink ejection port 8. Afterward, when the individual electrode 35 is returned to the original potential, the piezoelectric sheets 41 to 44 return to the original flat shape and the pressure chamber 10 also returns to its original volume. Thus, the pressure chamber 10 sucks ink therein through the corresponding manifold channel 5.

In another driving method, all the individual electrodes 35 are set in advance at a different potential from that of the common electrode 34 so that the piezoelectric sheets 41 to 44 are deformed into convex shapes toward the respective pressure chambers 10. When an ejecting request is issued, the corresponding individual electrode 35 is once set at the same potential as that of the common electrode 34. Afterward, at a predetermined timing, the individual electrode 35 is again set at the different potential from that of the common electrode 34. In this case, at the timing when the individual electrode 35 is set at the same potential as that of the common electrode 34, the piezoelectric sheets 41 to 44 return to their original shapes. The corresponding pressure chamber 10 is thereby increased in volume from its initial state, i.e., the state that the potentials of both electrodes differ from each other, to suck ink from the corresponding manifold channel 5 into the pressure chamber 10. Afterward, at the timing when the individual electrode 35 is again set at the different potential from that of the common electrode 34, the piezoelectric sheets 41 to 44 are deformed into a convex shape toward the pressure chamber 10. The volume of the pressure chamber 10 is thereby decreased and the pressure of ink in the pressure chamber 10 increases to eject ink.

In case that the polarization occurs in the reverse direction to the electric field applied to the piezoelectric sheet 41, the active portion in the piezoelectric sheet 41 sandwiched by the individual and common electrodes 35 and 34 is ready to elongate perpendicularly to the polarization. As a result, the piezoelectric sheets 41 to 44 are deformed into a concave shape toward the pressure chamber 10 by the transversal piezoelectric effect. Therefore, the volume of the pressure chamber 10 is increased to suck ink from the manifold channel 5. Afterward, when the individual electrode 35 return to their original potential, the piezoelectric sheets 41 to 44 also return to their original flat shape. The pressure chamber 10 thereby returns to its original volume to eject ink through the ink ejection port 8.

Figure 11A:
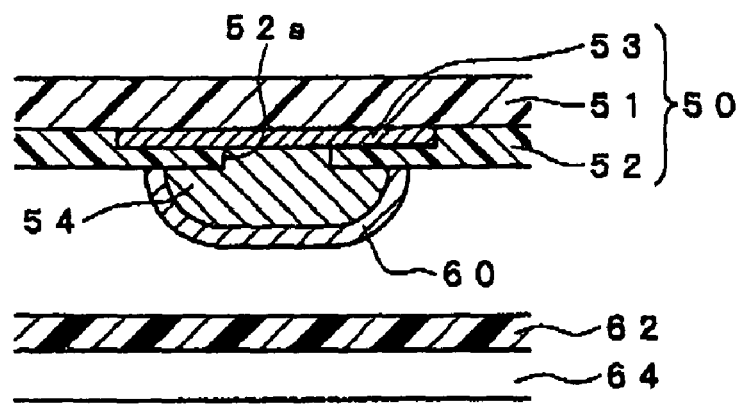
FIG. 11A is a partial sectional view illustrating a state before a work for disposing an epoxy resin on a surface of solder covering a terminal, in a process for connecting the terminal to a land, in a manufacturing method of an inkjet head according to the first embodiment of the present invention.

As illustrated in FIG. 11A, the FPC 50 includes therein a base film 51, conductive patterns 53 formed on the lower face of the base film 51, and a cover film 52 covering substantially the whole of the lower face of the base film 51. The base film 51 has a thickness of about 25 micrometer. Each conductive pattern 53 has a thickness of about 9 micrometer. The cover film 52 has a thickness of about 20 micrometer. Through-holes 52a each having an area smaller than that of a conductive pattern 53 are formed in the cover film 52 so as to correspond to the respective conductive patterns 53. The base film 51, the conductive patterns 53, and the cover film 52 are put in layers with being positioned to one another so that the center of each through-hole 52a corresponds to the center of a conductive pattern 53 and the peripheral edge of each conductive pattern 53 is covered with the cover film 52. A terminal 54 of the FPC 50 is connected to the corresponding conductive pattern 53 through the through-hole 52a.

Either of the base film 51 and the cover film 52 is made of an insulating sheet material. In this embodiment, the base film 51 is made of a polyimide resin. The cover film 52 is made of a photosensitive material. Because the cover film 52 is made of such a photosensitive material, a large number of through-holes 52a can be easily formed.

Each conductive pattern 53 is made of a copper foil. The conductive patterns 53 are wires connected to the driver IC 80 and made into a predetermined pattern on the lower face of the base film 51.

Each terminal 54 is made of a conductive material such as nickel. The terminal 54 plugs the corresponding through-hole 52a and covers the lower face of the cover film 52 at the peripheral edge around the through-hole 52a. The terminal 54 protrudes toward the piezoelectric sheet 41. The terminal 54 has a diameter of about 50 micrometer and a thickness of about 30 micrometer from the lower face of the cover film 52.

The FPC 50 includes therein a large number of terminals 54, each of which corresponds to one land 36 (see FIGS. 10A and 10B). Therefore, each individual electrode 35 electrically connected to the corresponding land 36 is electrically connected to the driver IC 80 through an independent conductive pattern 53 in the FPC 50. Thus, the potential of each pressure chamber 10 can be controlled independently.

Next, an example of method for fabricating a head main body 1a of the inkjet head 1 will be described. To fabricate a head main body 1a, in general, an ink passage unit 4 and an actuator unit 21 are separately fabricated in parallel and then they are bonded to each other.

To fabricate an ink passage unit 4, each of plates 22 to 30 to constitute the ink passage unit 4 is etched using a patterned photoresist as a mask to form openings and recesses as illustrated in FIGS. 6 and 8 in the plates 22 to 30. Afterward, the nine plates 22 to 30 are put in layers with an adhesive being interposed so that an ink passage 32 as illustrated in FIG. 6 is formed therein. The plates 22 to 30 is thus bonded to each other to form an ink passage unit 4.

To fabricate an actuator unit 21, first, a conductive paste to be a common electrode 34 is printed into a pattern on a green sheet of a ceramic material to be a piezoelectric sheet 42. Afterward, four piezoelectric sheets 41 to 44 are put in layers with being positioned to each other using a jig. The thus-obtained layered structure is baked at a predetermined temperature. The baked layered structure having no individual electrode 35 is then bonded to the ink passage unit 4 with an adhesive such that the piezoelectric sheet 44 is in contact with the cavity plate 22.

Afterward, a conductive paste to be individual electrodes 35 is printed into a pattern on a surface of the piezoelectric sheet 41. Further, a conductive paste to be lands 36 is printed into a pattern on one end of the conductive paste to be each individual electrode 35, more specifically, on one end of the connecting portion 35b of each individual electrode 35 (see FIGS. 10A and 10B). Afterward, through a baking process, the pastes are sintered. Thereby, individual electrodes 35 are formed on the surface of the piezoelectric sheet 41 and further a land 36 is formed on one end of the connecting portion 35b of each individual electrode 35.

Afterward, for supplying electric signals to the individual electrodes 35, terminals of an FPC 50 are connected to the respective lands 36. Further, through a predetermined process, manufacture of an inkjet head 1 is completed.

Figure 11B:
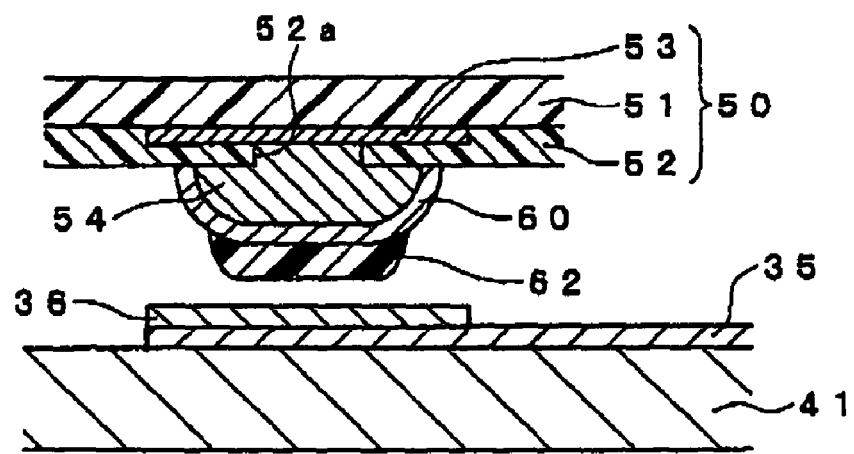
FIG. 11B is a partial sectional view, successive to FIG. 11A, illustrating a state wherein the terminal on which the solder and the epoxy resin are disposed, and the land are opposed to each other.
Figure 11C:
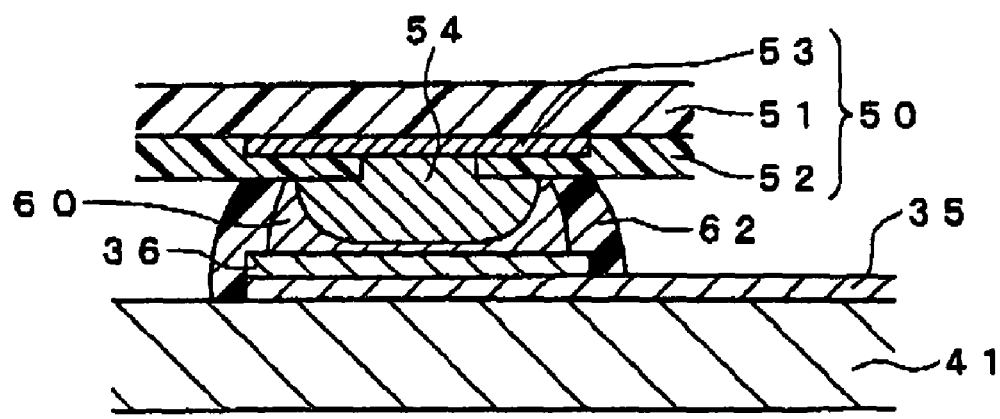
FIG. 11C is a partial sectional view, successive to FIG. 11B, illustrating a state wherein the terminal and the land are connected to each other.
Figure 11D:
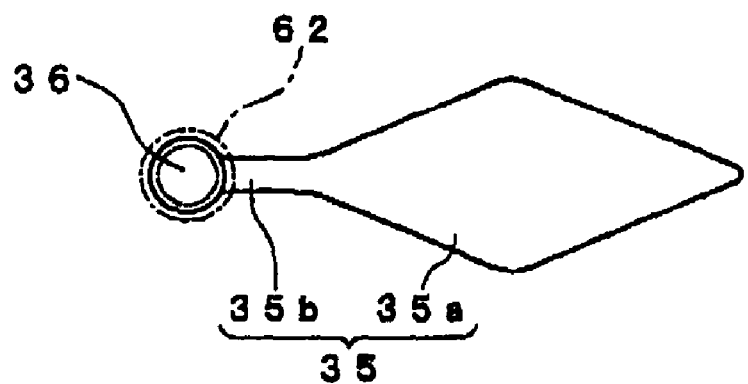
FIG. 11D is a plan view, corresponding to FIG. 10B, illustrating an occupation area of the epoxy resin in the state of FIG. 11C.

Next, a process for connecting a terminal to a land in a manufacturing method of an inkjet head according to the first embodiment of the present invention will be described with reference to FIGS. 11A to 11D. FIGS. 11A to 11C illustrate a process for connecting a terminal to a land, in the order of steps. FIG. 11D is a plan view, corresponding to FIG. 10B, illustrating an occupation area of an epoxy resin in the state of FIG. 11C.

First, as illustrated in FIG. 11A, a solder 60 having a thickness of about 7 to 8 micrometer is disposed so as to cover the whole of a surface of the terminal 54. Afterward, the FPC 50 including the terminals 54 is opposed to an epoxy resin 62 applied to a surface of a flat member 64, and then each terminal 54 is pressed onto the flat member 64 so that the epoxy resin 62 is transferred thereto. Thereby, as illustrated in FIG. 11B, the epoxy resin 62 having a diameter of about 0.1 mm adheres to the surface of the solder 60. The epoxy resin 62 in FIG. 11A preferably has a thickness of 10 micrometer, and about 60 to 70% the thickness of the epoxy resin 62 is transferred to the surface of the solder 60 though it depends on wettability.

Afterward, with positioning each terminal 54 to the corresponding land 36, the FPC 50 is brought near the piezoelectric sheet 41 and then pressed in a direction so that the land 36 and the terminal 54 get close to each other. In this pressing process, first, the epoxy resin 62 comes into contact with the surface of the land 36. In progress of the pressing process, the epoxy resin 62 moves perpendicularly to a direction in which the land 36 and the terminal 54 are opposed to each other, i.e., horizontally in FIG. 11B, and then the epoxy resin 62 is discharged from the gap between the land 36 and the terminal 54. Thereby, the epoxy resin 62 spreads out onto the connecting portion 35b of the surface electrode 35 and surrounds the land 36, the terminal 54, and the solder 60, as illustrated in FIGS. 11C and 11D. The epoxy resin 62 connects the cover film 52 of the FPC 50 to the piezoelectric sheet 41. Accordingly, the solder 60 is disposed in the gap between the land 36 and the terminal 54, while the epoxy resin 62 is disposed in a region around the land 36 and the terminal 54 with connecting both to each other. That is, only the solder 60 is interposed between the land 36 and the terminal 54 so that the land 36 and the terminal 54 come into contact so as to be electrically connected to each other through the solder 60.

Afterward, for example, a non-illustrated ceramic heater is disposed on the surface of the base film 51 of the FPC 50 to heat. At this time, the epoxy resin 62 is thermosetting in which the heated resin is softened to a degree that it can be processed, the further heated resin is hardened by a chemical reaction, and the once-hardened resin is never softened even when it is heated. When the solder 60 starts to be melted by being heated, the epoxy resin 62 is scarcely hardened and in a soft condition. The epoxy resin 62 is scarcely deformed with heat and kept substantially in the condition as illustrated in FIGS. 11C and 11D. Afterward, by being further heated, the epoxy resin 62 becomes in substantially the same state as in FIGS. 11C and 11D, because the epoxy resin 62 has the viscosity as well. That is, the epoxy resin 62 becomes completely hardened, in the state when the above-described pressing process is completed, with connecting both the cover film 52 and the piezoelectric sheet 41 and also with covering the peripheries of solder 60 connecting the land 36 and the terminal 54.

The epoxy resin 62 and the solder 60 are not mixed with each other in the heating process.

Figure 12:
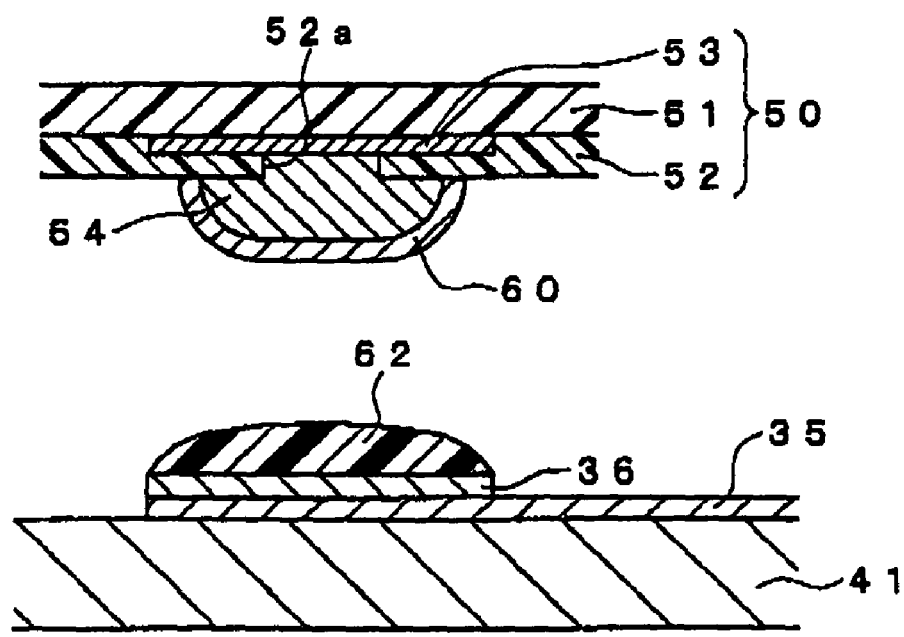
FIG. 12 is a partial sectional view, corresponding to FIG. 11B, illustrating a modification of the manufacturing method of the inkjet head according to the first embodiment of the present invention.

FIG. 12B illustrates a modification of the process for connecting a terminal to a land in the manufacturing method of the inkjet head according to the above-described embodiment. FIG. 12 is a partial sectional view corresponding to FIG. 11B. In the above-described embodiment, as illustrated in FIG. 11B, the epoxy resin 62 adheres to the surface of the solder 60. In this modification, however, the epoxy resin 62 adheres not to the surface of the solder 60 but to the surface of the land 36. Even in case of performing the pressing and heating processes in the state of FIG. 12, the same state as in FIGS. 11C and 11D of the above-described embodiment is obtained as a result.

As described above, in the inkjet head 1 of this embodiment, because the interconnecting portion between each land 36 and the corresponding terminal 54 is in a region not opposed to the corresponding pressure chamber 10, hindrance of deformation of the piezoelectric element of the actuator unit 21, i.e., the piezoelectric sheets 41 to 44, can be suppressed. Therefore, because the volume of each pressure chamber 10 can be efficiently reduced, the problem of deterioration of ink ejection performance is relieved.

Further, because the solder 60 is covered with the epoxy resin 62 that has fluidity lower than that of a metallic material such as the solder 60 even by being heated, movement of the solder 60 can be suppressed. In addition, because the epoxy resin 62 has spread out to the outside of the connecting portion 35b of the surface electrode 35 and surrounds the land 36, the terminal 54, and the solder 60 (see FIGS. 11C and 11D), such problems are relieved as hindrance of deformation of the piezoelectric element, rise of the resistance, and braking, which may occur when the solder 60 adheres to the main electrode portion 35a of the individual electrodes 35, and also a short circuit between terminals which may occur when the solder 60 adheres to the neighboring terminal interconnecting portions.

In case of using only solder, from the viewpoint of bonding strength, it is required to relatively increase the area of the interconnecting portion between a terminal and an electrode, or to increase the amount of use of solder. However, either of the measures of increasing the interconnecting portion between a terminal and an electrode and of increasing the amount of use of solder is disadvantageous for a highly dense arrangement of pressure chambers. Such a highly dense arrangement of pressure chambers is a recent demand for inkjet heads, and therefore there is a tendency that the interconnecting portions between electrodes provided to correspond to the respective pressure chambers and terminals of a printed circuit board are arranged at narrow intervals. In case of such a narrow interval between interconnecting portions, it is difficult to increase the area of each interconnecting portion. On the other hand, in case of increasing the amount of use of solder, the problems such as hindrance of deformation of the piezoelectric element, rise of the resistance, braking, and a short circuit may become more remarkable.

In this embodiment, however, because the epoxy resin 62 surrounds the land 36, the terminal 54, and the solder 60, sufficient bonding strength can be ensured even if the bonding area between the land 36 and the terminal 54 is made relatively small or the amount of use of solder 60 is made relatively little. That is, this embodiment suitably meets the recent demand of a highly dense arrangement of pressure chambers, i.e., even in case that the pressure chambers 10 are arranged in a matrix in a plane of the ink passage unit 4 as in this embodiment so that the pressure chambers 10 are highly densely arranged.

Because the epoxy resin 62 is disposed in a region opposed to no pressure chamber 10, hindrance of deformation of the piezoelectric element of the actuator unit 21, i.e., the piezoelectric sheets 41 to 44, can be suppressed more surely.

As illustrated in FIGS. 11C and 11D, the epoxy resin 62 is disposed only in the vicinity of the land 36 and does not adhere to the piezoelectric sheet 41 and the individual electrode 35 more than it is needed. This is suitable from the viewpoint of suppressing hindrance of deformation of the piezoelectric element of the actuator unit 21, i.e., the piezoelectric sheets 41 to 44, and the economical viewpoint of suppressing the amount of use of the material.

Because the thermosetting epoxy resin 62 is used, the epoxy resin 62 can be hardened with heat in a state that the epoxy resin 62 covers the whole of the outer surface of the solder 60. That is, when the solder 60 is melted by being heated to have high fluidity, the epoxy resin 62 is in a soft state to suppress the flow of the solder 60. The epoxy resin 62 is then hardened. This surely suppresses the movement of the solder 60 from the vicinity of the land 36, and further improves the bonding strength between the terminal and electrode.

In general, in case of using only solder, flux must be used. In case of using the epoxy resin 62 as in this embodiment, however, because the epoxy resin 62 tends to contain a small amount of ingredient functioning similarly to the flux, no flux need be used. This is convenience economically and environmentally.

Because pressure chambers 10 are arranged in a matrix in a plane of the ink passage unit 4, a large number of nozzles can be provided at a high density and therefore image printing at a high resolution is possible.

In FIGS. 11A to 11C and 12, either of the surfaces of the terminal 54 and the land 36 is smooth. In practice, however, for reasons of process, at least minute unevenness in height is generally formed in either of the surfaces of the terminal 54 and the land 36. Therefore, it is difficult to bring a large number of terminals 54 of the FPC 54 and a large number of lands 36 of the actuator unit 21 into sure contact with each other by pressing evenly the FPC 50 and the actuator unit 21 onto each other so that the FPC 50 and the actuator unit 21 is brought near each other. For this reason, in this embodiment, the solder 60 is interposed in the narrow gap between the terminal 54 and the land 36 in each pair so that electrical connection between them is sure.

In the manufacturing method of this embodiment, because the interconnecting portion between the terminal 54 and the land 36 is in a region opposed to no pressure chamber 10, the force for pressing the terminal 54 onto the land 36 can be effectively transmitted in comparison with a case wherein the interconnecting portion is in a region opposed to a pressure chamber 10. This makes it easy to connect the terminal 54 and the land 36 to each other.

In the manufacturing method of this embodiment, the pressing process is performed after the solder 60 and the epoxy resin 62 are disposed between the terminal 54 and the land 36 in the order of the solder 60 and the epoxy resin 62 from the upper side. Thereby, before the heating process, the state as illustrated in FIGS. 11C and 11D can be easily realized wherein the epoxy resin 62 has been discharged from the gap between the terminal 54 and the land 36 and covers the outer surface of the solder 60.

Figure 13A:
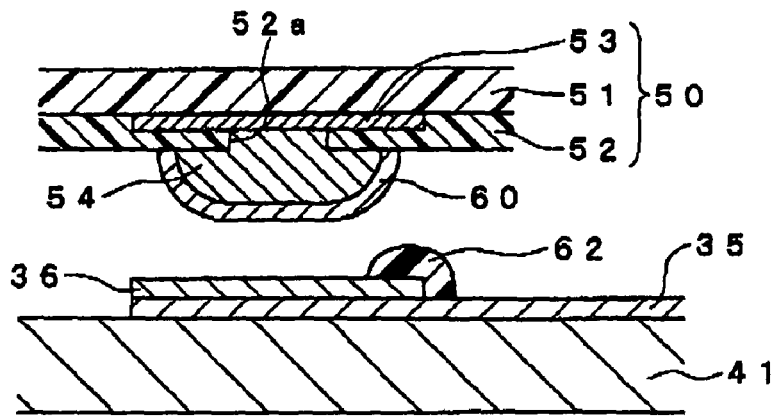
FIG. 13A is a partial sectional view, corresponding to FIG. 11B, illustrating a modification of the inkjet head according to the first embodiment of the present invention.
Figure 13B:
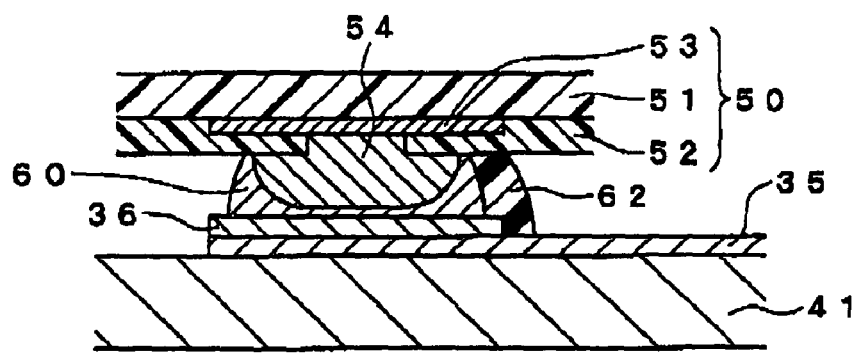
FIG. 13B is a partial sectional view, corresponding to FIG. 11C, successive to FIG. 13A, illustrating a state wherein the terminal and the land are connected to each other.
Figure 13C:
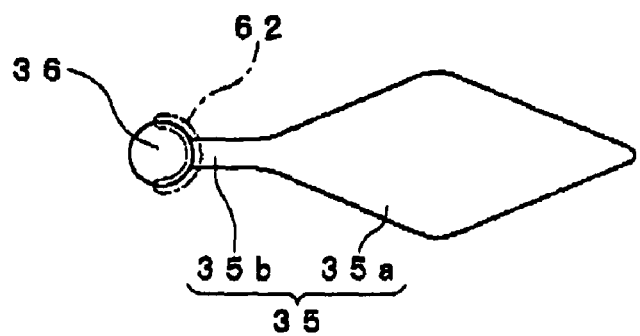
FIG. 13C is a plan view, corresponding to FIG. 10B, illustrating an occupation area of the epoxy resin in the state of FIG. 13B.

Next, a modification of the inkjet head according to the first embodiment of the present invention will be described with reference to FIGS. 13A to 13C. FIGS. 13A and 13B illustrate a process for connecting a terminal to a land, in the order of steps. FIG. 13C is a plan view, corresponding to FIG. 10B, illustrating an occupation area of an epoxy resin in the state of FIG. 13B. This modification is the same as the above-described embodiment except the shape of the epoxy resin 62 and thus description of the same feature will be omitted.

In this modification, as illustrated in FIG. 13A, the epoxy resin 62 is disposed only in a region between the land 36 and the corresponding pressure chamber 10 (see FIG. 10A) before the terminal 54 is pressed onto the land 36. In this modification, the state after the same pressing process as that described above is performed is as illustrated in FIGS. 13B and 13C. That is, the epoxy resin 62 covers only part of the solder 60, more specifically, only a portion of the solder 60 between the land 36 and the pressure chamber 10 (see FIG. 10A).

In this modification, the force necessary for spreading the epoxy resin 62 out may be weak in comparison with that in the above-described embodiment. Therefore, the terminal 54 can be connected to the land 36 by a relatively weak pressing force. This makes the connecting work easy.

If an excessive pressing force is applied to the piezoelectric sheets 41 to 44 constituting the actuator unit 21, it may hinder the ink ejection performance. However, this modification can relieve that problem.

Further, because the epoxy resin 62 can suppress movement of the melted solder 60 to the main electrode portion 35*a* of the individual electrode 35, the problems such as hindrance of deformation of the piezoelectric element, rise of the resistance, and braking are relieved. From the viewpoint of relieving the problem of a short circuit in addition to the problem described above, however, it is preferable that the epoxy resin 62 spreads out to the outside of the connecting portion 35*b* to surround the land 36, the terminal 54, and the solder 60 as in the above-described embodiment.

The epoxy resin 62 may cover at least part of the solder 60. The portion of the solder 60 to be covered with the epoxy resin 62 can be adequately modified. For example, when the epoxy resin 62 is disposed only in a region between neighboring connecting portions between land and terminal, a short circuit between the terminals can be suppressed, though the effect of preventing the hindrance of deformation of the piezoelectric element, rise of the resistance, and braking can not be obtained.

Further, the position where the solder 60 is disposed before the pressing process, is not limited to the whole of the surface of the terminal 54 as illustrated in FIG. 11A. It may be part of the surface of the terminal 54. Furthermore, it is not limited to the surface of the terminal 54. It may be the surface of the land 36. In this case, the epoxy resin 62 is disposed on the solder 60, i.e., on the side near the terminal 54.

As illustrated in FIG. 11C or 13B, the solder 60 is disposed in the gap between the land 36 and the terminal 54 and in the region bridging the gap along the peripheries of the land 36 and the terminal 54. However, the present invention is not limited to this feature. For example, even when the solder 60 is disposed only in the gap between the land 36 and the terminal 54, electrical connection between them can be realized. Further, if all the terminals 54 can be surely brought into contact with the respective lands 36 in the pressing process, the solder 60 may be disposed only in the region bridging the gap between each pair of land 36 and terminal 54 along the peripheries of the land 36 and the terminal 54. Even in this case, electrical connection between the lands 36 and the terminals 54 can be realized.

Further, as long as the solder 60 can be prevented from spreading out, the epoxy resin 62 may not be in contact with the cover sheet 52, and may not surround the land 36, the terminal 54, and the solder 60. However, when the epoxy resin 62 is in contact with the cover sheet 52, improvement of bonding between the land 36 and the terminal 54 is achieved in addition to the advantage of suppressing problems due to movement of the solder 60 as described above.

Further, the epoxy resin 62 may be disposed in a region opposed to the pressure chamber 10. From the viewpoint of suppressing hindrance of deformation of the piezoelectric element of the actuator unit 21, i.e., the piezoelectric sheets 41 to 44, however, the epoxy resin 62 is preferably disposed in a region which does not contribute to the deformation of the piezoelectric sheets 41 to 44, even the region opposed to the pressure chamber 10, or in a region not opposed to the pressure chamber 10 as in the above-described embodiment.

The epoxy resin 62 is disposed only in the vicinity of each land 36. However, the present invention is not limited to this feature. For example, the epoxy resin 62 can be disposed at an arbitrary position in a region between the FPC 50 and the piezoelectric sheet 41. From the viewpoint of suppressing hindrance of deformation of the piezoelectric element of the actuator unit 21, i.e., the piezoelectric sheets 41 to 44, and from the economical viewpoint of suppressing the amount of use of the material, however, the epoxy resin 62 is desirably disposed only in the vicinity of each land 36.

Further, in place of the epoxy resin 62, another thermosetting resin can be used.

Further, the metallic bond for electrically connecting the terminal 54 to the land 36 is not limited to the solder 60. Various metallic bonds such as tin are usable. However, the thermosetting resin and metallic bond to be used in the present invention must have natures in which both are not mixed with each other upon being heated.

Figure 14A:
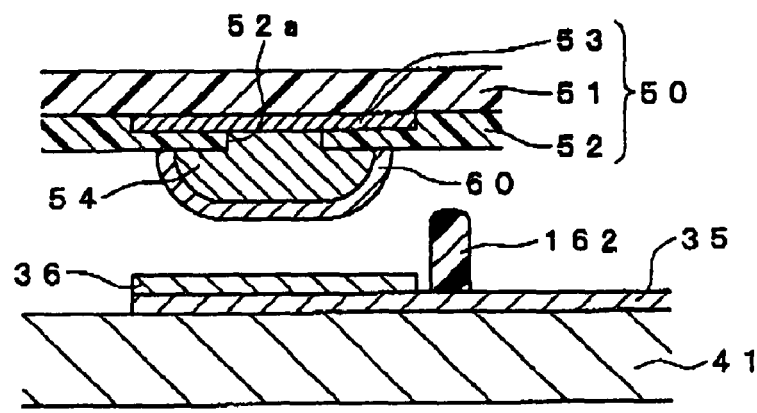
FIG. 14A is a partial sectional view, corresponding to FIG. 11B, illustrating another modification of the inkjet head according to the first embodiment of the present invention.
Figure 14B:
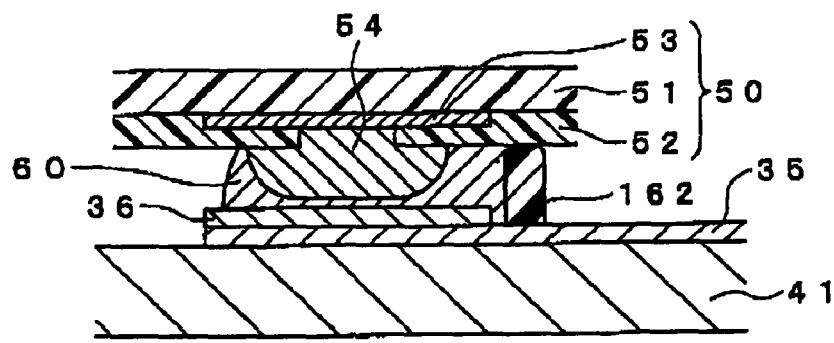
FIG. 14B is a partial sectional view, corresponding to FIG. 11C, successive to FIG. 14A, illustrating a state wherein the terminal and the land are connected to each other.
Figure 14C:
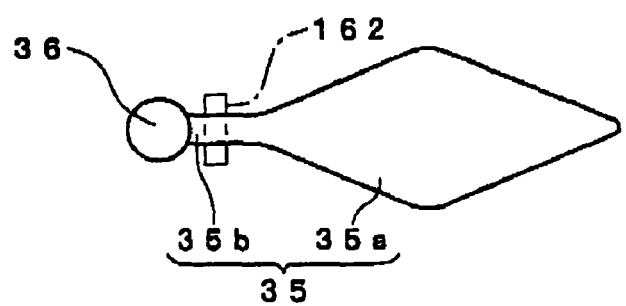
FIG. 14C is a plan view, corresponding to FIG. 10B, illustrating an occupation area of the epoxy resin in the state of FIG. 14B.

Next, another modification of the inkjet head according to the first embodiment of the present invention will be described with reference to FIGS. 14A to 14C. FIGS. 14A and 14B illustrate a process for connecting a terminal to a land, in the order of steps. FIG. 14C is a plan view, corresponding to FIG. 10B, illustrating an occupation area of an epoxy resin in the state of FIG. 14B. This modification is the same as the above-described embodiment except using a protrusion 162 in place of the epoxy resin 62 and thus description of the same feature will be omitted.

In this modification, as illustrated in FIG. 14A, a protrusion 162 has been formed on the connecting portion 35*b* of each individual electrode 35 in advance before the terminal 54 is pressed onto the land 36. As illustrated in FIG. 14C, the protrusion 162 extends to the outside of the connecting portion 35*b* substantially perpendicularly to a line extending through the main electrode portion 35*a* of the individual electrode 35 and the land 36. The protrusion 162 may be made of a thermosetting resin such as an epoxy resin, or may be made of a material other than thermosetting resins. In Addition, the protrusion 162 may be made of an inorganic material such as a silicon oxide and silicon nitride. That is, various materials can be used to form the protrusion 162 as long as the material has lower wettability (affinity) to the solder 60 having melted, if not intending the connection between the cover film 52 and the piezoelectric sheet by the protrusion 162.

After the protrusion 162 is formed on the connecting portion 35b as illustrated in FIG. 14A, the ink passage unit 4 and the actuator unit 21 are bonded to each other such that the land 36 and the protrusion 162 are in a region not opposed to the corresponding pressure chamber 10. Afterward, the solder 60 is disposed on the surface of the terminal 54 as described above, and then the pressing process is performed.

As apparent from FIGS. 14A and 14B, the protrusion 162 is not deformed in the pressing process.

As shown in 14B, the protrusion 162 is in contact with the cover sheet 52 of the FPC 50, and connects the actuator unit 21 and the FPC 50. This connection of the actuator unit 21 and the FPC 50 by the protrusion 162 strengthens bonding force between them. However, the protrusion 162 may not connect the actuator unit 21 and the FPC 50, but needs to suppress movement of the solder 60 having melted in soldering toward the main electrode portion 35a. For example, height of the protrusion 162 may be smaller then the distance between the cover film 52 and the piezoelectric sheet 41 formed by contact of the terminal 54 and the land 36.

In this modification, the protrusion 162 suppresses movement of the solder 60 to the main electrode portion 35a of the individual electrode 35. Therefore, like the above-described embodiment, the effect is obtained of relieving the problems such as hindrance of deformation of a piezoelectric element, rise of the resistance, and braking.

Because the protrusion 162 extends across the connecting portion 35b to the outside of the connecting portion 35b substantially perpendicularly to a line extending through the main electrode portion 35a and the land 36, movement of the solder 60 toward the main electrode portion 35a of the individual electrode 35 can be effectively suppressed.

By adequately changing the height or position of the protrusion 162, the effect of suppressing the movement of the solder 60 can be controlled. For example, the protrusion 162 may be formed so as to surround the land 36, the terminal 54, and the solder 60 like the epoxy resin 62 of the first embodiment.

Figure 15A:
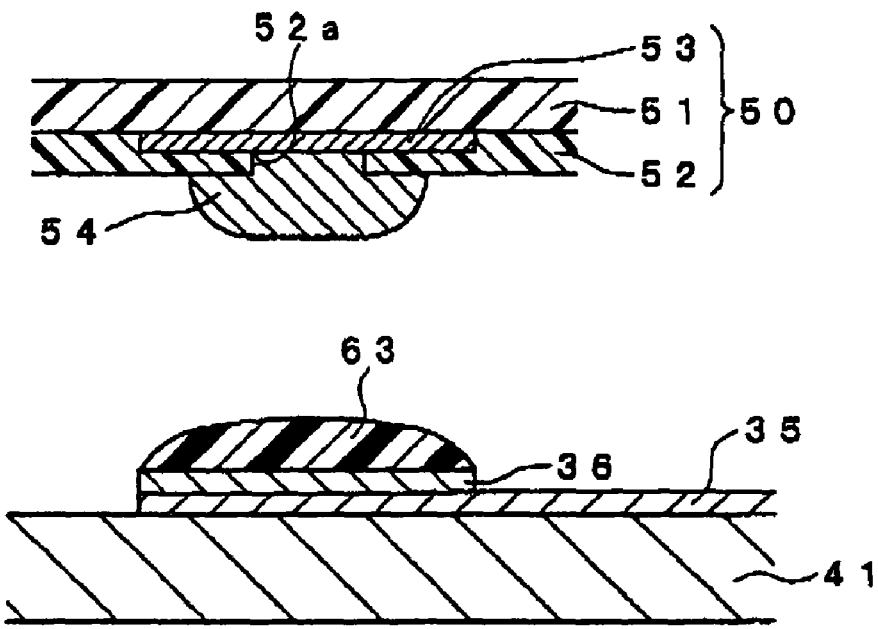
FIG. 15A is a partial sectional view corresponding to FIG. 11B, in a manufacturing method of an inkjet head according to a second embodiment of the present invention.
Figure 15B:
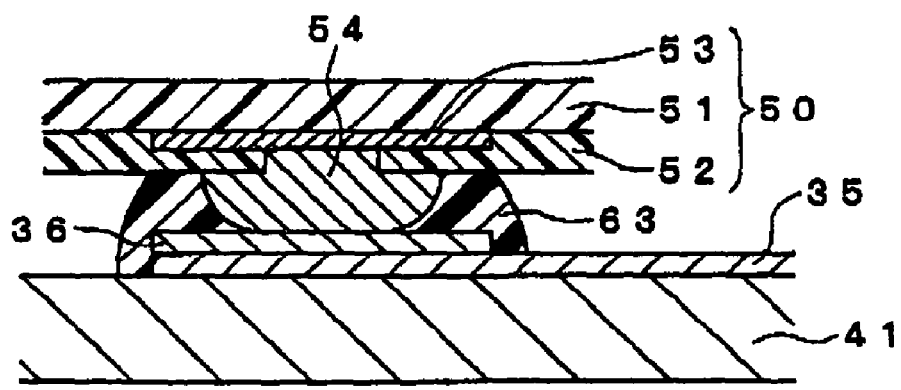
FIG. 15B is a partial sectional view, corresponding to FIG. 11C, successive to FIG. 15A, illustrating a state wherein the terminal and the land are connected to each other.

Next, a process for connecting a terminal to a land in a manufacturing method of an inkjet head according to a second embodiment of the present invention will be described with reference to FIGS. 15A and 15B. FIGS. 15A and 15B illustrate a process for connecting a terminal to a land, in the order of steps. This embodiment is the same as the above-described first embodiment except the connecting portion between a terminal 54 and a land 36 and thus description of the same feature will be omitted.

In this embodiment, an ACP (Anisotropic Conductive Paste) 63 is used for connecting a terminal 54 to a land 36, in place of using the solder 60 and the epoxy resin 62.

First, as illustrated in FIG. 15A, an ACP 63 is disposed on a surface of a land 36 by, e.g., transferring or printing. Afterward, with positioning each terminal 54 to the corresponding land 36, the FPC 50 is brought near the piezoelectric sheet 41 and then pressed in a direction so that the land 36 and the terminal 54 get close to each other. In this pressing process, first, the ACP 63 comes into contact with the surface of the land 36. In progress of the pressing process, the most part of the ACP 63 moves perpendicularly to a direction in which the land 36 and the terminal 54 are opposed to each other, i.e., horizontally in FIG. 11B. Thereby, as illustrated in FIG. 15B, in the vicinity of the land 36, the most part of the ACP 63 covers the side face of the terminal 54 and surrounds the peripheries of the land 36 and the terminal 54. On the other hand, the remaining part of the ACP 63 stays in the narrow gap between the land 36 and the terminal 54, and conductive particles in the ACP 63 electrically connects the land 36 and the terminal 54 to each other.

Afterward, by performing the same heating process as in the above-described first embodiment, the thermosetting ACP 63 is completely hardened in substantially the same state as in FIG. 15B, i.e., in the state when the above-described pressing process is completed.

As described above, in this embodiment, electrical connection between the land 36 and the terminal 54 is realized by the ACP 63. Thus, without using the solder 60 as in the first embodiment, the terminal 54 and the land 36 can be connected to each other only with a single bond of the ACP 63. This makes the manufacture relatively easy.

Also in this embodiment, like the first embodiment, because the interconnecting portion between each land 36 and the corresponding terminal 54 is in a region not opposed to the corresponding pressure chamber 10, hindrance of deformation of the piezoelectric sheets 41 to 44 can be suppressed. Therefore, because the volume of each pressure chamber 10 can be efficiently reduced, the problem of deterioration of ink ejection performance is relieved.

Further, because the ACP 63 is used for electrically connecting each land 36 to the corresponding terminal 54 in place of a metallic bond such as solder 60, the problems such as hindrance of deformation of a piezoelectric element, rise of the resistance, and braking, together with the problem of a short circuit between terminals can be relieved.

Further, because the ACP 63 is disposed in a region not opposed to the pressure chamber 10, hindrance of deformation of the piezoelectric element of the actuator unit 21, i.e., the piezoelectric sheets 41 to 44, can be suppressed.

Further, as apparent from FIG. 15B, because the ACP 63 surrounds the land 36 and the terminal 54, sufficient bonding strength can be ensured. Therefore, like the first embodiment, this embodiment also suitably meets the recent demand of a highly dense arrangement of pressure chambers, i.e., even in case that the pressure chambers 10 are arranged in a matrix in a plane of the ink passage unit 4 as in this embodiment so that the pressure chambers 10 are highly densely arranged.

Further, because the ACP 63 containing conductive particles is used, even in case that terminals 54 do not surely come into contact with the respective lands 36 when the FPC 50 is brought near the piezoelectric sheet 41, the ACP 63 is between each terminal 54 and the corresponding land 36 to realize electrical connection between them. Besides, although solder 60 must be heated to about 200 degrees C. for melting, heating to about 100 degrees C. suffices in this embodiment. This is because the ACP 63 is hardened at about 100 degrees C.

The ACP 63 is disposed in the gap between the land 36 and the terminal 54 and in the region bridging the gap along the peripheries of the land 36 and the terminal 54. However, the present invention is not limited to this feature. For example, even when the ACP 63 is disposed only in the gap between the land 36 and the terminal 54, electrical connection between them can be realized. Further, if all the terminals 54 can be surely brought into contact with the respective lands 36 in the pressing process, the ACP 63 may be disposed only in the region bridging the gap between each pair of land 36 and terminal 54 along the peripheries of the land 36 and the terminal 54. Even in this case, electrical connection between the lands 36 and the terminals 54 can be realized.

The ACP 63 may not surround the land 36 and the terminal 54 and may cover only part of the gap between them. Further, the present invention is not limited to the feature that the ACP 63 is disposed only in the vicinity of each land 36. For example, the ACP 63 can be disposed at an arbitrary position in a region between the FPC 50 and the piezoelectric sheet 41 if the position is in a region not opposed to any pressure chamber 10. From the viewpoint of suppressing hindrance of deformation of the piezoelectric element of the actuator unit 21, i.e., the piezoelectric sheets 41 to 44, and from the economical viewpoint of suppressing the amount of use of the material, however, the ACP 63 is desirably disposed only in the vicinity of each land 36.

In this embodiment, the ACP 63 is used as a bond. However, the present invention is not limited to this feature. For example, various other thermosetting resins such as an NCP (Non-conductive Paste) are usable. In case of using a thermosetting resin, e.g., an NCP, other than that containing conductive particles, such as the ACP 63, however, no gap must be formed between any terminal 54 and the corresponding land 36 to bring them into contact with each other, and the resin must be disposed around them. In case of including many terminals 54 and many lands 36 as in this embodiment, it is very difficult in practice to eliminate a gap from any connecting portion between them. For this reason, each terminal 54 is preferably made of a relatively soft material such as gold. This makes it easy to eliminate a gap from any connecting portion.

Further, the position where the ACP 63 is disposed before the pressing process is not limited to the whole of the surface of each land 36 as illustrated in FIG. 15A. It may be part of the surface of the land 36 or may be a surface of each terminal 54.

Further, the pressure chambers 10 formed in the ink passage unit 4 may not be arranged in a matrix. Further, the piezoelectric element of the actuator unit 21 may not have its size extending over pressure chambers 10 as the piezoelectric sheets 41 to 44. A piezoelectric element may be provided for each pressure chamber 10.

In either of the above-described first and second embodiments, the state after the heating process scarcely changes from the state after the pressing process. However, the present invention is not limited to this feature. For example, it suffices if the state after the heating process, i.e., the state after the hardening reaction of the thermosetting resin is completed, is the state as illustrated in FIGS. 11C and 11D, FIGS. 13B and 13C, or FIG. 15B.

An inkjet head of the present invention is not limited to that of a line printing type inkjet printer as in the above-described embodiments in which printing is performed with moving a print paper relatively to the fixed head main body 2a. For example, the present invention is applicable also to an inkjet head of a serial printing type inkjet printer in which printing is performed on a print paper with a head main body reciprocating perpendicularly to the movement of the print paper.

Further, an inkjet head of the present invention is not limited to that of an inkjet printer. For example, the present invention is applicable also to an inkjet head of an inkjet facsimile or copying machine.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. An inkjet head comprising:
   an ink passage unit including a plurality of pressure chambers and a plurality of wall portions defining each of the plurality of pressure chambers;
   an actuator unit including a piezoelectric element disposed on the ink passage unit, a surface electrode disposed on the piezoelectric element and having a main electrode portion opposed to a pressure chamber of the plurality of pressure chambers and a connecting portion opposed to a wall portion of the plurality of wall portions defining each of the plurality of pressure chambers of the ink passage unit, and a land disposed on the piezoelectric element in a region opposed to the wall portion, the land being electrically connected to the surface electrode;
   a printed circuit board on which a terminal electrically connected to the land and a predetermined wiring pattern are provided;
   a metallic bond for electrically connecting the land to the terminal, the metallic bond being disposed in at least one of a region between the land and the terminal and a region extending over the land and the terminal along the peripheries of the land and the terminal; and
   a protrusion disposed on the connecting portion between the main electrode portion and the land, wherein:
   the protrusion is provided for the land and the terminal that are electrically connected to form one land and terminal pair, and the protrusion is independent of another protrusion provided for another land and terminal pair that are electrically connected, and
   a space provided by a region opposed to the pressure chamber exists between the one land and terminal pair and the another land and terminal pair.

2. The inkjet head according to claim 1, wherein the protrusion extends to the outside of the connecting portion to surround the land, the terminal, and the metallic bond.

3. The inkjet head according to claim 1, wherein the protrusion extends across the connecting portion substantially perpendicularly to a straight line extending through the main electrode portion and the land, to the outside of the connecting portion.

4. The inkjet head according to claim 1, wherein the protrusion connects the actuator unit and the printed circuit board.

5. The inkjet head according to claim 1, wherein the protrusion is made of a thermosetting resin.

6. The inkjet head according to claim 1, wherein the protrusion is made of an epoxy resin.

7. The inkjet head according to claim 1, wherein the plurality of pressure chambers are arranged in a matrix in a plane of the ink passage unit, and the piezoelectric element of the actuator unit has a size to extend over the plurality of pressure chambers.

8. An inkjet head comprising:
   an ink passage unit including a plurality of pressure chambers and a plurality of wall portions defining each of the plurality of pressure chambers;
   an actuator unit including a piezoelectric element disposed on the ink passage unit, a surface electrode disposed on the piezoelectric element and having a main electrode portion opposed to a pressure chamber of the plurality of pressure chambers and a connecting portion opposed to a wall portion of the plurality of wall portions defining each of the plurality of pressure chambers of the ink passage unit, and a land disposed on the piezoelectric element in a region opposed to the wall portion, the land being electrically connected to the surface electrode;

a printed circuit board on which a terminal electrically connected to the land and a predetermined wiring pattern are provided;

a metallic bond for electrically connecting the land to the terminal, the metallic bond being disposed in at least one of a region between the land and the terminal and a region extending over the land and the terminal along the peripheries of the land and the terminal; and a thermosetting resin covering at least part of the metallic bond, wherein:

the thermosetting resin is provided for the land and the terminal that are electrically connected to form one land and terminal pair, and the thermosetting resin is independent of another thermosetting resin provided for another land and terminal pair that are electrically connected, and a space provided by a region opposed to the pressure chamber exists between the one land and terminal pair and the another land and terminal pair.

9. The inkjet head according to claim 8, wherein the thermosetting resin extends to the outside of the connecting portion to surround the land, the terminal, and the metallic bond.

10. The inkjet head according to claim 8, wherein the thermosetting resin extends across the connecting portion substantially perpendicularly to a straight line extending through the main electrode portion and the land, to the outside of the connecting portion.

11. The inkjet head according to claim 8, wherein the thermosetting resin is disposed in a region opposed to the wall portion.

12. The inkjet head according to claim 8, wherein the thermosetting resin is an epoxy resin.

13. The inkjet head according to claim 8, wherein the plurality of pressure chambers are arranged in a matrix in a plane of the ink passage unit, and the piezoelectric element of the actuator unit has a size to extend over the plurality of pressure chambers.

14. An inkjet head comprising:

an ink passage unit including a plurality of pressure chambers and a plurality of wall portions defining each of the plurality of pressure chambers;

an actuator unit including a piezoelectric element disposed on the ink passage unit, a surface electrode disposed on the piezoelectric element and having a main electrode portion opposed to a pressure chamber of the plurality of pressure chambers and a connecting portion opposed to a wall portion of the plurality of wall portions defining each of the plurality of pressure chambers of the ink passage unit, and a land disposed on the piezoelectric element in a region opposed to the wall portion, the land being electrically connected to the surface electrode;

a printed circuit board on which a terminal electrically connected to the land and a predetermined wiring pattern are provided; and a thermosetting resin for electrically connecting the land to the terminal, the thermosetting resin being disposed in a region opposed to the wall portion, wherein:

the thermosetting resin is provided for the land and the terminal that are electrically connected to form one land and terminal pair, and the thermosetting resin is independent of another thermosetting resin provided for another land and terminal pair that are electrically connected, and a space provided by a region opposed to the pressure chamber exists between the one land and terminal pair and the another land and terminal pair.

15. The inkjet head according to claim 14, wherein the thermosetting resin extends to the outside of the connecting portion to surround the land and the terminal.

16. The inkjet head according to claim 14, wherein the thermosetting resin is an ACP (Anisotropic Conductive Paste).

17. The inkjet head according to claim 14, wherein the plurality of pressure chambers are arranged in a matrix in a plane of the ink passage unit, and the piezoelectric element of the actuator unit has a size to extend over the plurality of pressure chambers.

18. An inkjet head comprising:

an ink passage unit including a plurality of pressure chambers and a plurality of wall portions defining each of the plurality of pressure chambers;

a plurality of actuator units, each actuator unit including a piezoelectric element disposed on the ink passage unit, a plurality of surface electrodes disposed on the piezoelectric element, and a plurality of lands electrically connected to the surface electrodes, each surface electrode having a main electrode portion opposed to one of the pressure chambers and a connecting portion opposed to one of the wall portions, each land being disposed on the piezoelectric element in a region opposed to one of the wall portions, and each of the lands being electrically connected to a different one of the surface electrodes;

a printed circuit board including a plurality of terminals and a predetermined wiring pattern, each of the terminals being electrically connected to a different one of the lands;

a plurality of metallic bonds, one metallic bond being provided for each electrically connected land and terminal pair, the metallic bond being disposed in at least one of a region between the land and the terminal of the pair and a region extending over and along peripheries of the land and the terminal of the pair; and a plurality of protrusions, one protrusion being provided for each electrically connected land and terminal pair and being disposed on the connecting portion between the main electrode portion and the land, wherein each protrusion that is provided for each electrically connected land and terminal pair is independent of other protrusions provided for other electrically connected land and terminal pairs, and further wherein a space exists between each land and terminal pair and an adjacent land and terminal pair, the space being provided by a region opposed to one of the plurality of pressure chambers.

19. An inkjet head comprising:

an ink passage unit including a plurality of pressure chambers and a plurality of wall portions defining each of the plurality of pressure chambers;

a plurality of actuator units, each actuator unit including a piezoelectric element disposed on the ink passage unit, a plurality of surface electrodes disposed on the piezoelectric element, and a plurality of lands electrically connected to the surface electrodes, each surface electrode having a main electrode portion opposed to one of the pressure chambers and a connecting portion opposed to one of the wall portions, each land being disposed on the piezoelectric element in a region opposed to one of the wall portions, and each of the lands being electrically connected to a different one of the surface electrodes;

a printed circuit board including a plurality of terminals and a predetermined wiring pattern, each of the terminals being electrically connected to a different one of the lands;

a plurality of metallic bonds, one metallic bond being provided for each electrically connected land and terminal pair, the metallic bond being disposed in at least one of a region between the land and the terminal of the pair and a region extending over and along peripheries of the land and the terminal of the pair; and a plurality of thermosetting resins, one thermosetting resin being provided for each electrically connected land and terminal pair and covering at least part of the metallic bond, wherein each thermosetting resin that is provided for each electrically connected land and terminal pair is independent of other thermosetting resin provided for other electrically connected land and terminal pairs, and further wherein a space exists between each land and terminal pair and an adjacent land and terminal pair, the space being provided by a region opposed to one of the plurality of pressure chambers.

20. An inkjet head comprising:

an ink passage unit including a plurality of pressure chambers and a plurality of wall portions defining each of the plurality of pressure chambers;

a plurality of actuator units, each actuator unit including a piezoelectric element disposed on the ink passage unit, a plurality of surface electrodes disposed on the piezoelectric element, and a plurality of lands electrically connected to the surface electrodes, each surface electrode having a main electrode portion opposed to one of the pressure chambers and a connecting portion opposed to one of the wall portions, each land being disposed on the piezoelectric element in a region opposed to one of the wall portions, and each of the lands being electrically connected to a different one of the surface electrodes;

a printed circuit board including a plurality of terminals and a predetermined wiring pattern, each of the terminals being electrically connected to a different one of the lands; and a plurality of thermosetting resins, one thermosetting resin being provided for each electrically connected land and terminal pair and being disposed in a region opposed to one of the wall portions, wherein each thermosetting resin that is provided for each electrically connected land and terminal pair is independent of other thermosetting resin provided for other electrically connected land and terminal pairs, and further wherein a space exists between each land and terminal pair and an adjacent land and terminal pair, the space being provided by a region opposed to one of the plurality of pressure chambers.

* * * * *